United States Patent
Ndiege et al.

(10) Patent No.: US 9,245,739 B2
(45) Date of Patent: Jan. 26, 2016

(54) LOW-K OXIDE DEPOSITION BY HYDROLYSIS AND CONDENSATION

(71) Applicant: Lam Research Corporation, Femont, CA (US)

(72) Inventors: Nicholas Muga Ndiege, San Jose, CA (US); Krishna Nittala, Sunnyvale, CA (US); Derek B. Wong, San Jose, CA (US); George Andrew Antonelli, Portland, OR (US); Nerissa Sue Draeger, Fremont, CA (US); Patrick A. Van Cleemput, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/464,196

(22) Filed: Aug. 20, 2014

(65) Prior Publication Data

US 2015/0004806 A1 Jan. 1, 2015

Related U.S. Application Data

(63) Continuation-in-part of application No. 13/461,287, filed on May 1, 2012, which is a continuation-in-part of application No. 12/625,468, filed on Nov. 24, 2009, now Pat. No. 8,187,951, which is a continuation of application No. 11/925,514, filed on Oct. 26, 2007, now Pat. No. 7,629,227.

(60) Provisional application No. 60/856,193, filed on Nov. 1, 2006.

(51) Int. Cl.
*H01L 21/02* (2006.01)

(52) U.S. Cl.
CPC ...... *H01L 21/02164* (2013.01); *H01L 21/0234* (2013.01); *H01L 21/02211* (2013.01); *H01L 21/02277* (2013.01); *H01L 21/02345* (2013.01)

(58) Field of Classification Search
CPC ............... H01L 21/02164; H01L 21/02126
See application file for complete search history.

(56) References Cited

U.S. PATENT DOCUMENTS

| 4,099,990 A | 7/1978 | Brown et al. |
| 4,740,480 A | 4/1988 | Ooka |

(Continued)

FOREIGN PATENT DOCUMENTS

| CN | 1655330 A | 8/2005 |
| CN | 1722403 A | 1/2006 |

(Continued)

OTHER PUBLICATIONS

U.S. Appl. No. 14/464,071, filed Aug. 20, 2014, entitled "Flowable Dielectric For Selective Ultra Low-K Pore Sealing."

(Continued)

*Primary Examiner* — William Coleman
(74) *Attorney, Agent, or Firm* — Weaver Austin Villeneuve & Sampson LLP

(57) ABSTRACT

Methods for depositing flowable dielectric films using halogen-free precursors and catalysts on a substrate are provided herein. Halogen-free precursors and catalysts include self-catalyzing aminosilane compounds and halogen-free organic acids. Flowable films may be used to fill pores in existing dielectric films on substrates having exposed metallization layers. The methods involve hydrolysis and condensation reactions.

20 Claims, 13 Drawing Sheets

(56) References Cited

U.S. PATENT DOCUMENTS

| | | | |
|---|---|---|---|
| 4,923,720 A | 5/1990 | Lee et al. |
| 5,281,274 A | 1/1994 | Yoder |
| 5,320,983 A | 6/1994 | Ouellet |
| 5,387,546 A | 2/1995 | Maeda et al. |
| 5,516,721 A | 5/1996 | Galli et al. |
| 5,525,157 A | 6/1996 | Hawkins et al. |
| 5,534,731 A | 7/1996 | Cheung |
| 5,747,381 A | 5/1998 | Wu et al. |
| 5,753,886 A | 5/1998 | Iwamura et al. |
| 5,807,785 A | 9/1998 | Ravi |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 5,970,383 A | 10/1999 | Lee |
| 5,990,013 A | 11/1999 | Berenguer et al. |
| 6,013,581 A | 1/2000 | Wu et al. |
| 6,054,379 A | 4/2000 | Yau et al. |
| 6,060,384 A | 5/2000 | Chen et al. |
| 6,072,227 A | 6/2000 | Yau et al. |
| 6,114,224 A | 9/2000 | Ngo et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,242,366 B1 | 6/2001 | Beekman et al. |
| 6,287,989 B1 | 9/2001 | Dobson |
| 6,300,219 B1 | 10/2001 | Doan et al. |
| 6,309,933 B1 | 10/2001 | Li et al. |
| 6,323,123 B1 | 11/2001 | Liu et al. |
| 6,383,951 B1 | 5/2002 | Li |
| 6,399,213 B2 | 6/2002 | Shiokawa |
| 6,413,583 B1 | 7/2002 | Moghadam et al. |
| 6,448,187 B2 | 9/2002 | Yau et al. |
| 6,475,564 B1 | 11/2002 | Carter et al. |
| 6,544,858 B1 | 4/2003 | Beekman et al. |
| 6,613,695 B2 | 9/2003 | Pomarede et al. |
| 6,635,586 B2 | 10/2003 | Goo et al. |
| 6,640,840 B1 | 11/2003 | MacNeil |
| 6,653,247 B2 | 11/2003 | MacNeil |
| 6,660,663 B1 | 12/2003 | Cheung et al. |
| 6,743,436 B1 | 6/2004 | Lee et al. |
| 6,743,736 B2 | 6/2004 | Mardian et al. |
| 6,787,463 B2 | 9/2004 | Mardian et al. |
| 6,790,737 B2 | 9/2004 | Schneegans et al. |
| 6,812,135 B2 | 11/2004 | Li et al. |
| 6,828,162 B1 | 12/2004 | Halliyal et al. |
| 6,846,757 B2 | 1/2005 | MacNeil |
| 6,858,195 B2 | 2/2005 | Aronowitz et al. |
| 6,902,947 B2 | 6/2005 | Chinn et al. |
| 6,972,262 B2 | 12/2005 | Lee et al. |
| 6,984,561 B2 | 1/2006 | Herner et al. |
| 6,995,056 B2 | 2/2006 | Lee et al. |
| 7,033,945 B2 | 4/2006 | Byun et al. |
| 7,056,560 B2 | 6/2006 | Yim et al. |
| 7,071,126 B2 | 7/2006 | Johnston et al. |
| 7,074,690 B1 | 7/2006 | Gauri et al. |
| 7,074,727 B2 | 7/2006 | Hsu et al. |
| 7,084,505 B2 | 8/2006 | Hamada et al. |
| 7,153,783 B2 | 12/2006 | Lu et al. |
| 7,211,525 B1 | 5/2007 | Shanker et al. |
| 7,238,604 B2 | 7/2007 | Kloster et al. |
| 7,365,000 B2 | 4/2008 | Lee et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,575,633 B2 | 8/2009 | Romanin |
| 7,582,555 B1 | 9/2009 | Lang et al. |
| 7,585,704 B2 | 9/2009 | Belyansky et al. |
| 7,589,012 B1 | 9/2009 | Seo et al. |
| 7,622,369 B1 | 11/2009 | Lee et al. |
| 7,629,227 B1 * | 12/2009 | Wang et al. ............ 438/452 |
| 7,648,927 B2 * | 1/2010 | Singh et al. ............. 438/792 |
| 7,655,532 B1 | 2/2010 | Chen et al. |
| 7,727,906 B1 | 6/2010 | Shanker et al. |
| 7,794,544 B2 | 9/2010 | Nguyen et al. |
| 7,804,130 B1 | 9/2010 | Fung |
| 7,825,044 B2 | 11/2010 | Mallick et al. |
| 7,888,233 B1 | 2/2011 | Gauri et al. |
| 7,888,273 B1 | 2/2011 | Wang et al. |
| 7,915,139 B1 | 3/2011 | Lang et al. |
| 7,999,356 B2 * | 8/2011 | Nakasaki et al. ............ 257/632 |
| 8,178,159 B2 * | 5/2012 | Baikerikar et al. ........... 427/162 |
| 8,187,951 B1 | 5/2012 | Wang et al. |
| 8,278,224 B1 | 10/2012 | Mui et al. |
| 8,481,403 B1 | 7/2013 | Gauri et al. |
| 8,535,767 B1 | 9/2013 | Kimura |
| 8,557,712 B1 | 10/2013 | Antonelli et al. |
| 8,580,697 B1 | 11/2013 | Lang et al. |
| 8,685,867 B1 | 4/2014 | Danek et al. |
| 8,728,958 B2 | 5/2014 | Ashtiani et al. |
| 8,809,161 B2 | 8/2014 | Gauri et al. |
| 8,846,536 B2 | 9/2014 | Draeger et al. |
| 9,064,684 B1 | 6/2015 | Mui et al. |
| 2002/0006729 A1 | 1/2002 | Geiger et al. |
| 2003/0040199 A1 | 2/2003 | Agarwal |
| 2003/0066482 A1 | 4/2003 | Pokharna et al. |
| 2003/0077887 A1 | 4/2003 | Jang et al. |
| 2003/0146416 A1 | 8/2003 | Takei et al. |
| 2003/0159655 A1 | 8/2003 | Lin et al. |
| 2003/0194861 A1 | 10/2003 | Mardian et al. |
| 2003/0210065 A1 | 11/2003 | Lu et al. |
| 2004/0048455 A1 | 3/2004 | Karasawa et al. |
| 2004/0152342 A1 | 8/2004 | Li et al. |
| 2004/0169005 A1 | 9/2004 | Kim et al. |
| 2004/0224496 A1 | 11/2004 | Cui et al. |
| 2005/0026443 A1 | 2/2005 | Goo et al. |
| 2005/0112282 A1 | 5/2005 | Gordon et al. |
| 2005/0136684 A1 | 6/2005 | Mukai et al. |
| 2005/0150453 A1 | 7/2005 | Simmons et al. |
| 2005/0181566 A1 | 8/2005 | Machida et al. |
| 2005/0191863 A1 | 9/2005 | Olmer et al. |
| 2005/0212179 A1 | 9/2005 | Honda et al. |
| 2005/0260864 A1 | 11/2005 | Huang et al. |
| 2006/0014384 A1 | 1/2006 | Lee et al. |
| 2006/0024912 A1 | 2/2006 | Lee |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2007/0054505 A1 | 3/2007 | Antonelli et al. |
| 2007/0281495 A1 | 12/2007 | Mallick et al. |
| 2007/0298585 A1 | 12/2007 | Lubomirsky et al. |
| 2008/0020591 A1 | 1/2008 | Balseanu et al. |
| 2008/0081434 A1 | 4/2008 | Nam et al. |
| 2008/0132087 A1 | 6/2008 | Xia et al. |
| 2008/0318439 A1 | 12/2008 | Ito et al. |
| 2009/0020847 A1 | 1/2009 | Byun et al. |
| 2009/0053895 A1 | 2/2009 | Oshima et al. |
| 2009/0061647 A1 | 3/2009 | Mallick et al. |
| 2009/0104789 A1 | 4/2009 | Mallick et al. |
| 2009/0104790 A1 | 4/2009 | Liang |
| 2009/0298257 A1 | 12/2009 | Lee et al. |
| 2009/0321936 A1 | 12/2009 | Kojima et al. |
| 2010/0109155 A1 | 5/2010 | Liu et al. |
| 2010/0167533 A1 | 7/2010 | Lim et al. |
| 2011/0081782 A1 | 4/2011 | Liang et al. |
| 2011/0151678 A1 | 6/2011 | Ashtiani et al. |
| 2012/0149213 A1 | 6/2012 | Nittala et al. |
| 2012/0161405 A1 | 6/2012 | Mohn et al. |
| 2012/0164328 A1 | 6/2012 | Kojima et al. |
| 2013/0122718 A1 | 5/2013 | Kato et al. |
| 2013/0230987 A1 | 9/2013 | Draeger et al. |
| 2014/0004717 A1 | 1/2014 | Chan et al. |
| 2014/0017904 A1 | 1/2014 | Gauri et al. |
| 2014/0150647 A1 * | 6/2014 | Ahn et al. ............ 95/51 |
| 2014/0302689 A1 | 10/2014 | Ashtiani et al. |
| 2015/0044882 A1 | 2/2015 | Draeger et al. |

(56) References Cited

U.S. PATENT DOCUMENTS

2015/0118862 A1     4/2015   Reilly et al.
2015/0118863 A1     4/2015   Rathod et al.

FOREIGN PATENT DOCUMENTS

| | | |
|---|---|---|
| CN | 101079391 A | 11/2007 |
| EP | 1 063 692 A1 | 12/2000 |
| JP | 2001-148382 | 5/2001 |
| JP | 2010-153859 | 7/2010 |
| WO | WO 99/22043 A1 | 5/1999 |
| WO | WO 2007/140376 | 12/2007 |
| WO | WO 2007/140424 | 12/2007 |
| WO | WO 2011/072143 | 6/2011 |

OTHER PUBLICATIONS

U.S. Appl. No. 13/461,287, filed May 1, 2012, entitled "CVD Flowable Gap Fill".
U.S. Appl. No. 12/986,070, filed Jan. 6, 2011, entitled "Density Gradient-Free Gap Fill".
U.S. Appl. No. 13/607,511, filed Sep. 7, 2012, entitled "Flowable Oxide Deposition Using Rapid Delivery of Process Gases".
U.S. Appl. No. 14/249,272, filed Apr. 9, 2014, entitled "Methods and Apparatus for Dielectric Deposition."
U.S. Appl. No. 14/466,222, filed Aug. 22, 2014, entitled "Flowable Oxide Film With Tunable Wet Etch Rate".
US Office Action, dated Aug. 23, 2005, issued in U.S. Appl. No. 10/810,066.
US Notice of Allowance and Fee Due, dated Feb. 15, 2006, issued in U.S. Appl. No. 10/810,066.
US Office Action, dated Jun. 27, 2008, issued in U.S. Appl. No. 11/447,594.
US Notice of Allowance and Fee Due, dated Dec. 11, 2008, issued in U.S. Appl. No. 11/447,594.
US Office Action, dated May 24, 2010, issued in U.S. Appl. No. 12/411,243.
US Final Office Action, dated Sep. 13, 2010, issued in U.S. Appl. No. 12/411,243.
US Notice of Allowance, dated Oct. 6, 2010, issued in U.S. Appl. No. 12/411,243.
US Office Action, dated May 18, 2012, issued in U.S. Appl. No. 12/984,524.
US Final Office Action, dated Sep. 14, 2012, issued in U.S. Appl. No. 12/984,524.
US Notice of Allowance, dated Mar. 7, 2013, issued in U.S. Appl. No. 12/984,524.
US Office Action, dated Dec. 16, 2013, issued in U.S. Appl. No. 13/935,398.
US Notice of Allowance, dated Apr. 11, 2014, issued in U.S. Appl. No. 13/935,398.
US Office Action, dated Oct. 26, 2007, issued in U.S. Appl. No. 11/323,812.
US Final Office Action, dated Apr. 9, 2008, issued in U.S. Appl. No. 11/323,812.
US Office Action, dated Oct. 9, 2008, issued in U.S. Appl. No. 11/323,812.
US Notice of Allowance and Fee Due, dated Apr. 23, 2009, issued in U.S. Appl. No. 11/323,812.
US Notice of Allowance, dated Nov. 18, 2010, issued in U.S. Appl. No. 12/508,461.
US Notice of Allowance, dated Aug. 6, 2012, issued in U.S. Appl. No. 13/031,077.
US Notice of Allowance, dated Jul. 8, 2013, issued in U.S. Appl. No. 13/031,077.
US Office Action, dated Nov. 4, 2008, issued in U.S. Appl. No. 11/925,514.
US Final Office Action, dated Jun. 17, 2009, issued in U.S. Appl. No. 11/925,514.
US Notice of Allowance, dated Jul. 29, 2009, issued in U.S. Appl. No. 11/925,514.
US Office Action, dated Apr. 26, 2011, issued in U.S. Appl. No. 12/625,468.
US Final Office Action, dated Oct. 14, 2011, issued in U.S. Appl. No. 12/625,468.
US Notice of Allowance, dated Jan. 31, 2012, issued in U.S. Appl. No. 12/625,468.
US Office Action, dated Aug. 15, 2013, issued in U.S. Appl. No. 13/461,287.
US Office Action, dated Feb. 28, 2014, issued in U.S. Appl. No. 13/461,287.
US Final Office Action, dated Aug. 26, 2014, issued in U.S. Appl. No. 13/461,287.
US Office Action, dated Nov. 12, 2008, issued in U.S. Appl. No. 11/834,581.
US Final Office Action, dated Aug. 6, 2009, issued in U.S. Appl. No. 11/834,581.
US Office Action dated Dec. 18, 2009, issued in U.S. Appl. No. 11/834,581.
US Final Office Action, dated Apr. 22, 2010, issued in U.S. Appl. No. 11/834,581.
US Notice of Allowance, dated Oct. 7, 2010, issued in U.S. Appl. No. 11/834,581.
US Office Action, dated Nov. 25, 2011, issued in U.S. Appl. No. 12/986,070.
US Final Office Action, dated Jun. 25, 2012, issued in U.S. Appl. No. 12/986,070.
US Office Action, dated Feb. 26, 2010, issued in U.S. Appl. No. 12/334,726.
US Final Office Action, dated Oct. 26, 2010, issued in U.S. Appl. No. 12/334,726.
US Office Action, dated Sep. 16, 2011, issued in U.S. Appl. No. 12/334,726.
US Final Office Action, dated Mar. 30, 2012, issued in U.S. Appl. No. 12/334,726.
US Final Office Action, dated Oct. 23, 2012, issued in U.S. Appl. No. 12/334,726.
US Notice of Allowance dated Jun. 10, 2013, issued in U.S. Appl. No. 12/334,726.
US Notice of Allowance, dated May 29, 2012, issued in U.S. Appl. No. 12/566,085.
US Notice of Allowance, dated Jun. 21, 2012, issued in U.S. Appl. No. 12/566,085.
US Office Action, dated Jun. 21, 2013, issued in U.S. Appl. No. 13/607,511.
US Final Office Action, dated Dec. 11, 2013, issued in U.S. Appl. No. 13/607,511.
US Office Action, dated Jul. 25, 2014, issued in U.S. Appl. No. 13/607,511.
US Office Action, dated Dec. 21, 2012, issued in U.S. Appl. No. 12/964,110.
US Final Office Action, dated Sep. 12, 2013, issued in U.S. Appl. No. 12/694,110.
US Notice of Allowance, dated Dec. 27, 2013, issued in U.S. Appl. No. 12/964,110.
US Notice of Allowance, dated Apr. 23, 2014, issued in U.S. Appl. No. 12/964,110.
US Office Action, dated Dec. 6, 2012, issued in U.S. Appl. No. 13/315,123.
US Office Action, dated Jul. 15, 2013, issued in U.S. Appl. No. 13/315,123.
US Notice of Allowance, dated Nov. 8, 2013, issued in U.S. Appl. No. 13/315,123.
US Office Action, dated Nov. 8, 2013, issued in U.S. Appl. No. 13/313,735.
US Final Office Action, dated Jul. 29, 2014, issued in U.S. Appl. No. 13/313,735.
US Office Action, dated Sep. 12, 2013, issued in U.S. Appl. No. 13/493,936.
US Final Office Action, dated Feb. 3, 2014, issued in U.S. Appl. No. 13/493,936.
US Notice of Allowance, dated May 22, 2014, issued in U.S. Appl. No. 13/493,936.

(56) References Cited

OTHER PUBLICATIONS

Japanese Office Action dated Sep. 17, 2013 issued in JP2009-282737.
Japanese Office Action dated Jun. 3, 2014 issued in JP2009-282737.
PCT International Search Report and Written Opinion dated Aug. 10, 2011 issued in PCT/US2010/059721.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Bekiari, V. et al. (1998) "Characterization of Photoluminescence from a Material Made by Interaction of (3-Aminopropyl)triethoxysilane with Acetic Acid," Langmuir, 14(13):3459-3461.
Chung, Sung-Woong et al. (Mar. 2004) "Flowable Oxide CVD Process for Shallow Trench Isolation in Silicon Semiconductor," Journal of Semiconductor Technology and Science, 4(1):45-51.
Brankova et al. (2003) "Photoluminescence from Sol-Gel Organic/Inorganic Hybrid Gels Obtained through Carboxylic Acid Solvolysis," Chem. Mater., 15(9):1855-1859.
Chung, Sung-Woong, et al. (2002) "Novel Shallow Trench Isolation Process Using Flowable Oxide CVD for sub-100nm DRAM," IEEE, IEDM, pp. 233-236.
Fessenden et al. (1961) "The Chemistry of Silicon-Nitrogen Compounds," Chem. Rev. 61(4)361-388.
Hatanaka, M., et al. (1991) "H2O-TEOS Plasma-CVD Realizing Dielectrics Having a Smooth Surface," IEEE, VMIC Conference, pp. 435-441.
Kessler et al.(2006) "New insight in the role of modifying ligands in the sol-gel processing of metal alkoxide precursors: A possibility to approach new classes of materials," J. Sol-Gel Sci. Techn. 40(2-3):163-179.
Matsuura, M., et al. (1994) "Novel Self-Planarizing CVD Oxide for Interlayer Dielectric Applications," IEEE, pp. 117-120.
Nakano, M., et al. (1989) "Digital CVD of SiO2," Extended Abstracts of the 21st Conference on Solid State Devices and Materials, Tokyo, pp. 49-52.
Noguchi, S. et al. (1987) "Liquid Phase Oxidation Employing O Atoms Produced by Microwave Discharge and Si(CH3)4," Extended Abstracts of the 19th Conference on Solid State Devices and Materials, Tokyo, pp. 451-454.
Sakaue, H., et al. (1990) "Digital Chemical Vapor Deposition of SiO2 Using a Repetitive Reaction of Triethylsilane /Hydrogen and Oxidation," Department of Electrical Engineering, Hiroshima University, pp. L 124-L 127.
Stathatos et al. (Jul. 19, 2003) "Study of Acetic Acid-Catalyzed Nanocomposite Organic/Inorganic Ureasil Sol-Gel Ionic Conductors," Langmuir, 19:(18)7587-7591.
US Notice of Allowance, dated Apr. 20, 2015, issued in U.S. Appl. No. 13/461,287.
U.S. Appl. No. 14/517,732, filed Oct. 17, 2014, entitled "Low-K Damage Repair and Pore Sealing Agents With Photosensitive End Groups."
US Office Action, dated Apr. 20, 2015, issued in U.S. Appl. No. 13/313,735.
Taiwan Office Action [no translation] dated Jun. 12, 2015 issued in TW 099143081.
Grill et al. (Nov. 15, 2003) "Structure of low dielectric constant to extreme low dielectric constant SiCOH films: Fourier transform infrared spectroscopy charaterization," Journal of Applied Physics, 94(10):6697-6707.
U.S. Appl. No. 14/519,400, filed Oct. 21, 2014, entitled "Treatment for Flowable Dielectric Deposition on Substrate Surfaces."
U.S. Appl. No. 14/519,712, filed Oct. 21, 2014, entitled "Methods and Apparatus for Forming Flowable Dielectric Films Having Low Porosity."
US Notice of Allowance, dated Jan. 23, 2015, issued in U.S. Appl. No. 13/607,511.
US Office Action, dated Oct. 10, 2014, issued in U.S. Appl. No. 13/313,735.
US Office Action, dated Dec. 9, 2014, issued in U.S. Appl. No. 14/466,222.
Chinese Second Office Action dated Dec. 15, 2014 issued in CN 2010-80055670.3.
Chinese First Office Action and Search Report dated Dec. 18, 2014 issued in CN 201110424193.X.
Chinese First Office Action and Search Report dated Jan. 6, 2015 issued in CN 201110442926.2.

\* cited by examiner

LOW-K OXIDE DEPOSITION BY HYDROLYSIS AND CONDENSATION

CROSS-REFERENCE TO RELATED APPLICATION

This application is a continuation-in-part of U.S. patent application Ser. No. 13/461,287, filed on May 1, 2012, titled "CVD FLOWABLE GAP FILL," which is a continuation-in-part of and claims priority under 35 U.S.C. §120 to U.S. application Ser. No. 12/625,468 (issued as U.S. Pat. No. 8,187,951), filed Nov. 24, 2009, which in turn is a continuation of Ser. No. 11/925,514, filed Oct. 26, 2007 (issued as U.S. Pat. No. 7,629,227), which claims benefit under 35 U.S.C. §119(e) to U.S. Provisional Application No. 60/856,193, filed Nov. 1, 2006. All of these applications are incorporated herein in their entireties by this reference.

BACKGROUND

As integrated circuits (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials.

Low-k materials are semiconductor-grade insulating materials that have a dielectric constant ("k") lower than that of silicon dioxide $SiO_2$, i.e., 3.9. With more and more advanced technology needs, ultra low-k dielectric (ULK) materials having a k less than 2.5 are used. ULK dielectrics can be obtained by incorporating voids within a low-k dielectric, creating a porous dielectric material. Applications of ULK dielectrics include back end of line (BEOL) interlayer dielectrics (ILDs).

SUMMARY

Provided herein are methods of depositing films on a semiconductor substrate. One aspect involves introducing process gases including a silicon-containing precursor, an oxidant, and a halogen-free acid catalyst compound to a reaction chamber; and exposing the substrate to the process gases under conditions such that a condensed flowable film forms on the substrate, such that the chemical reactions that form the flowable film includes a $S_N 1$ hydrolysis mechanism and condensation.

In some embodiments, the halogen-free catalyst compound is selected from the group consisting of acetic acid, and photosensitive organic acid catalysts, which may be selected from the group consisting of acetic acid, and photosensitive organic acid catalysts, which may be selected from the group consisting of sulfonic acid, picric acid, tartaric acid, citric acid, ethylenediaminetetraacetic acid, pyrophosphoric acid, substituted derivatives of these acids, and combinations thereof. In some embodiments, the substrate is exposed to the process gases while the substrate is exposed to UV radiation.

The oxidant may be selected from the group consisting of water, ozone, and a peroxide. In various embodiments, the silicon-containing precursor and the oxidant are introduced to the reaction chamber via separate inlets. In some embodiments, the halogen-free catalyst compound is introduced to the reaction chamber separate from the silicon-containing precursor and the oxidant.

In various embodiments, the method further includes treating the flowable film, which may include exposing the flowable film to the oxidant and exposing the film to a thermal or plasma environment. In some embodiments, the flowable film seals pores having an average critical dimension between about 1 Å and about 1 nm.

Another aspect involves a method of depositing a film on a semiconductor substrate by introducing process gases including a silicon-containing precursor, an oxidant, and a halogen-free catalyst compound to a reaction chamber; and exposing the substrate to the process gases under conditions such that a condensed flowable film forms on the substrate, such that the catalyst compound is selected from the group consisting of sulfonic acid, picric acid, tartaric acid, citric acid, ethylenediaminetetraacetic acid, pyrophosphoric acid, and combinations thereof.

In some embodiments, the flowable film includes a carbon-doped silicon oxide film.

Another aspect involves a method of depositing a film on a semiconductor substrate by introducing process gases including a silicon-containing precursor and an oxidant to a reaction chamber; and exposing the substrate to the process gases under conditions such that a condensed flowable film forms on the substrate, such that the silicon-containing precursor is a halogen-free self-catalyzing aminosilane compound, and the chemical reactions that form the flowable film includes a hydrolysis mechanism between an amine group on the aminosilane compound and the oxidant, and condensation.

In some embodiments, the silicon-containing precursor is halogen-free. In various embodiments, the method further includes treating the flowable film by exposing the flowable film to the oxidant. In some embodiments, the chemical structure of the silicon-containing precursor includes at least one N-alkylamine group.

The chemical structure of a silicon-containing precursor may include at least one ligand selected from the group consisting of N-alkyl amine; N,N dialkyl amine; alkoxy; alkyl; alkenyl; alkynyl; aromatic groups; and hydrogen. In some embodiments, the flowable film seals pores having an average critical dimension between about 1 Å and about 1 nm.

Another aspect involves a method of depositing a film on a semiconductor substrate by introducing process gases including a halogen-free silicon-containing precursor and an oxidant to a reaction chamber; and exposing the substrate to the process gases under conditions such that a condensed flowable film forms on the substrate, such that the halogen-free silicon-containing precursor is selected from the group consisting of dimethylamino trimethylsilane, dimethylaminotriethylsilane, bisdimethylaminodiethylsilane, trisdimethylamino methylsilane, trismethylamino methylsilane, trismethylamino silane, bisdimethylamino dimethylsilane, bisdimethylamino ethoxy methyl silane, methylamino diethoxy methyl silane, trismethylamino vinyl silane, bismethylamino divinyl silane, bisdimethylamino ethoxy vinyl silane acetoxysilane, and combinations thereof. In some embodiments, the method further includes treating the flowable film by exposing the flowable film to the oxidant.

These and other aspects are described further below with reference to the drawings.

DETAILED DESCRIPTION

Figure 1:
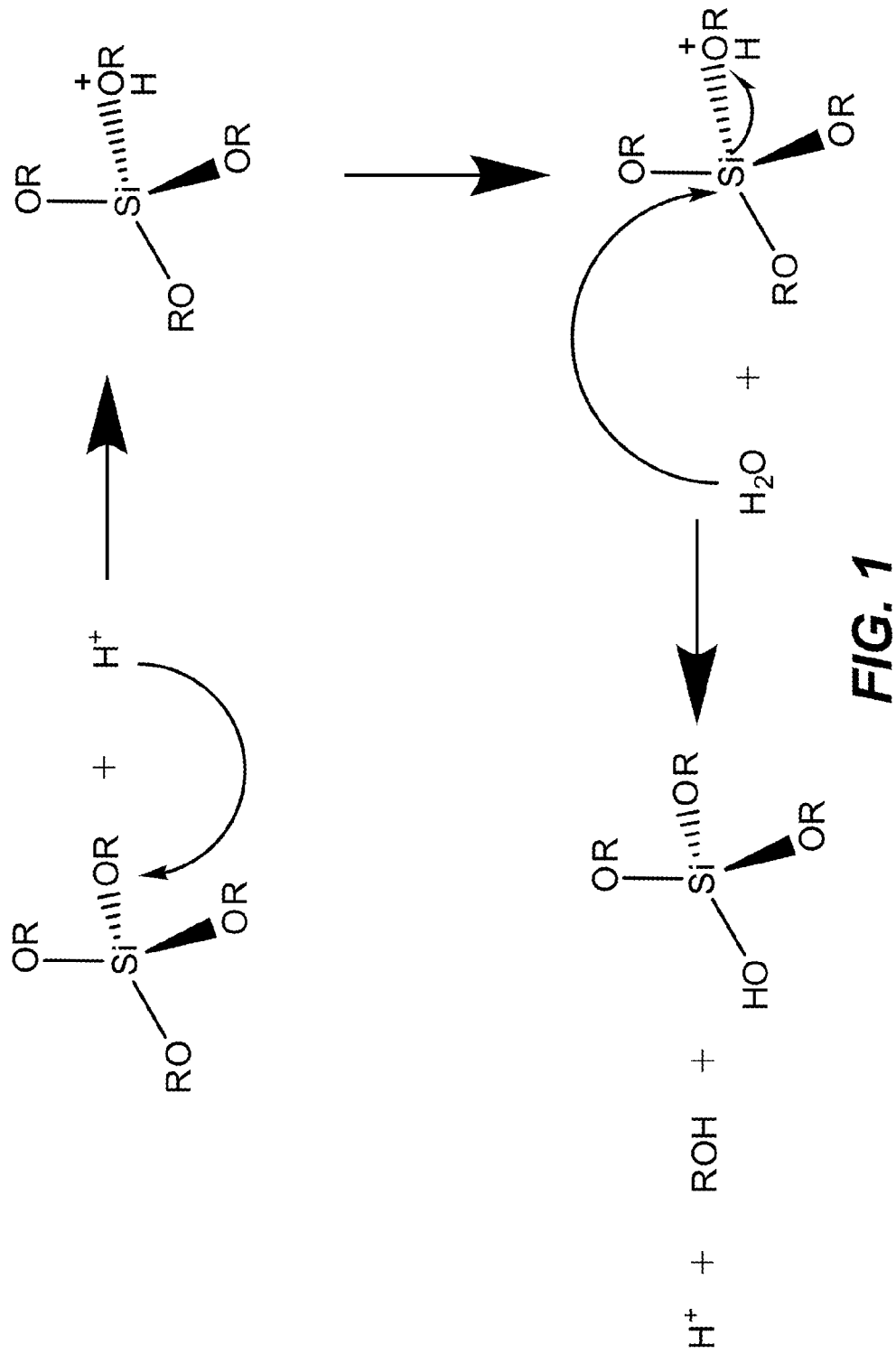
FIGS. 1, 2A, 2B, and 3 are schematic depictions of chemical mechanisms in accordance with various embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

As integrated circuits (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials.

Low-k materials are semiconductor-grade insulating materials that have a dielectric constant ("k") lower than that of silicon dioxide $SiO_2$, i.e., 3.9. With more and more advanced technology needs, ultra low-k dielectric (ULK) materials having a k less than 2.5 are used. ULK dielectrics can be obtained by incorporating voids within a low-k dielectric, creating a porous dielectric material. Applications of ULK dielectrics include back end of line (BEOL) interlayer dielectrics (ILDs).

Providing herein are methods of depositing dielectric films, including low-k films by mechanisms that result in the formation of a flowable dielectric film. As used herein, the term "flowable dielectric film" is a flowable doped or undoped dielectric film having flow characteristics that provide consistent fill of a gap or pore. The term "flowable oxide film" is used to refer to flowable doped or undoped silicon oxide films. The term "flowable dielectric film" can include any dielectric film that is formed from vapor-phase reactants and is flowable as-deposited, including films that have been treated such that they are no longer flowable. The term "as-deposited flowable dielectric film" refers to a flowable dielectric film prior to any post-deposition treatments, densification, or solidification. An as-deposited flowable dielectric film may be characterized as a soft jelly-like film, a gel having liquid flow characteristics, a liquid film, or a flowable film.

The methods disclosed herein may be particularly advantageous to deposit flowable oxide on a structure that includes exposed metal. In such an example of a BEOL application, a low-k dielectric film, such as an ultra-low carbon-doped oxide (ULK CDO) may be deposited to form an ILD, which is subsequently etched to form a recess and expose a metal line. The recess is ultimately filled with a metal, such as copper. The ILD may be porous, however, and subject to potential degradation of the film due to penetration by metal precursor films or metals through the pores of the ILD. A low-k film as disclosed herein may be used to seal the pores of the ILD.

The use of halogen-containing catalysts can be problematic, as these catalysts may react with the metallization layers that are exposed in some areas of the substrate—in particular, chlorides and bromides may be more susceptible to reacting with metallization layers. In one example, fluorides may corrode copper in an oxidizing regime or environment, so a fluorine-containing silicon precursor used to fill pores or gaps on the substrate may cause areas of the substrate to degrade. The degradation of these electrical properties on the substrate may eventually cause failure in microelectronic devices. Moreover, halide anions could be retained in the deposited film and leech out of a low-k dielectric layer and into other parts of the integrated structure, leading to corrosion during integration, longer processing times, and further processing steps. Halide anions also lead to mobile charges on the dielectric, which degrade the dielectric's insulating electrical properties.

The methods described herein include dielectric deposition in which gaps (e.g., gaps between gates) or pores (e.g., pores in an ILD layer) are filled with dielectric material using a halogen-free catalyst in a flowable oxide deposition. In certain embodiments, forming a flowable film involves reacting a silicon-containing precursor and an oxidant to form a condensed flowable film on the substrate. Formation of the film may be aided by a halogen-free catalyst or may be catalyzed by ligands of the silicon-containing precursor. The substrate is exposed to the process gases for a period sufficient to deposit a flowable film to fill at least some of the gap. The deposition process may form a soft jelly-like film with good flow characteristics, providing consistent fill. In certain embodiments, the flowable film is an organo-silicon film, e.g., an amorphous organo-silicon film. In certain embodiments, methods involve selectively condensing liquid in small spaces. The liquid can be a dielectric material or a precursor for a dielectric material to be deposited. Under certain physical conditions the liquid is either selectively deposited only in capillaries (e.g., pores or a narrow etched gap in a layer) or a bulk liquid can be removed by evaporation while the liquid in the capillaries remains condensed. By selectively depositing material in the narrow confined spaces of an integrated circuit, the process promotes bottom up or inside out fill.

The methods described herein may be used for pore sealing of a porous dielectric layer as described in U.S. patent application Ser. No. 14/464,071 titled "FLOWABLE DIELECTRIC FOR SELECTIVE ULTRA LOW-K PORE SEALING," filed concurrently herewith and incorporated herein by reference.

The methods can also be used for front end of line (FEOL) applications, in addition to BEOL applications. The methods are particularly useful for BEOL applications because the catalysts and precursors used are halogen-free and thereby may be used to fill pores with flowable films while underlying metal layers are exposed without degrading or reacting with the metal layers.

The advantages of using halogen-free catalyzed deposition include (1) elimination of corrosion of integrated structures, (2) prevention of trace levels of halide incorporation in the dielectric, and (3) reduction in cost due to use of an unmodified or undoped catalyst. Halogen-free organic acids may also be independently delivered to control the shrinkage and porosity of the deposited films by controlling the relative proportions of the precursor, catalyst, water, and solvent in the final mixture. Moreover, the deposition process may be repeated on the same film after the end of a deposition cycle to grow thicker film due to the formation of a hydrophilic surface on the top surface of the deposited film. The halogen-free precursors and/or catalysts as described in the methods herein fall under two categories: organic acids and self-catalyzing silanes.

Organic Acids

Deposition of silicon oxide dielectric films into pores or gaps may be catalyzed by a halogen-free organic acid using hydrolysis and condensation reactions. FIG. 1 is a depiction of an example of a chemical mechanism for hydrolysis of an organosilicon precursor using an acid catalyst. Hydronium ions are generated in solution, and the hydrolysis reaction may occur in an aqueous (water-containing) or non-aqueous/non-hydrolytic solution, which uses alcohols, solvents, or other chemicals as the source of hydroxide (—OH) ligands.

FIG. 1 shows an example $S_N 1$ mechanism for an acid-catalyzed hydrolysis of a silicon alkoxide reaction. As shown, in the first step, protonation of an —OR ligand occurs whereby the hydronium ion generated from the halogen-free organic acid attacks the oxygen in one of the ligands on the silicon alkoxide compound, forming an intermediate state having a hydrogen atom bound to the oxygen atom of the ligand and creating a slightly positive organic alcohol ROH group on the silicon alkoxide compound. In the next step, a concerted nucleophilic $S_N 1$ attack by an $H_2O$ water molecule occurs on the silicon center of the precursor, during desorption of the ROH alcohol leaving group and formation of a Si—OH bond. The resulting compound is a Si(OR)$_3$OH compound, ROH, and the hydronium ion is regenerated. In some embodiments, not all ligands on the Si(OR)$_4$ compound react with the hydronium ion. In various embodiments, one or more of the ligands bonded to the silicon center is an organic group and not an alkoxide. For example, a silicon compound that may be used instead of the silicon alkoxide depicted in FIG. 1 may have the chemical formula SiR(OR')$_3$ where R and R' are organic functional groups or other organic chains. The mechanism in FIG. 1 may be repeated for other ROH ligands on the silicon alkoxide compound, which may thereby form a silanol or alkylsilanol compound to be used in a subsequent condensation mechanism.

The proliferating Si—OH groups in the silanol or alkylsilanol compound proceed to polycondense and form an —Si—O—Si— network with an $H_2O$ molecule given off as a co-product with each condensation reaction. In various embodiments, after condensation, a carbon-doped silicon oxide film is formed. For example, various carbon atoms may be embedded in the film due to any unreacted —OR groups or remaining —R groups on the silicon centers. Condensation results in less branched oligomers and, depending on the conditions, may occur via three competitive mechanisms: alcoxolation, oxolation, and olation.

Alcoxolation is a reaction by which a bridging oxo group is formed through elimination of an alcohol molecule. The mechanism is essentially the same as for hydrolysis, with a silicon atom replacing the hydrogen atom in the entering group. The following chemical reaction represents an example of an alcoxolation reaction where M is the metal, such as silicon:

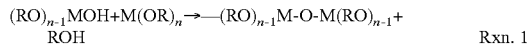
Rxn. 1

Figure 2A:
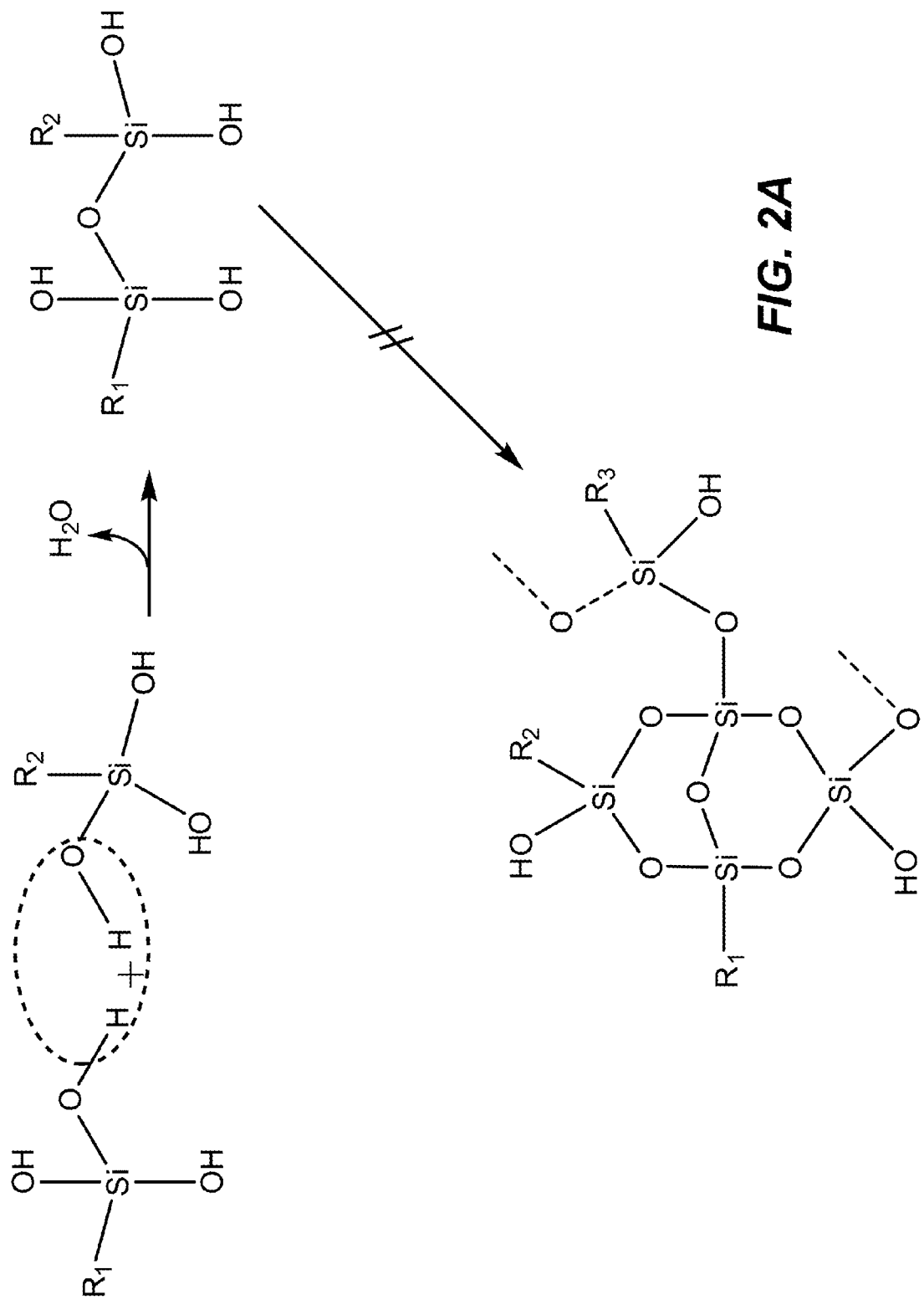
Figure 2B:
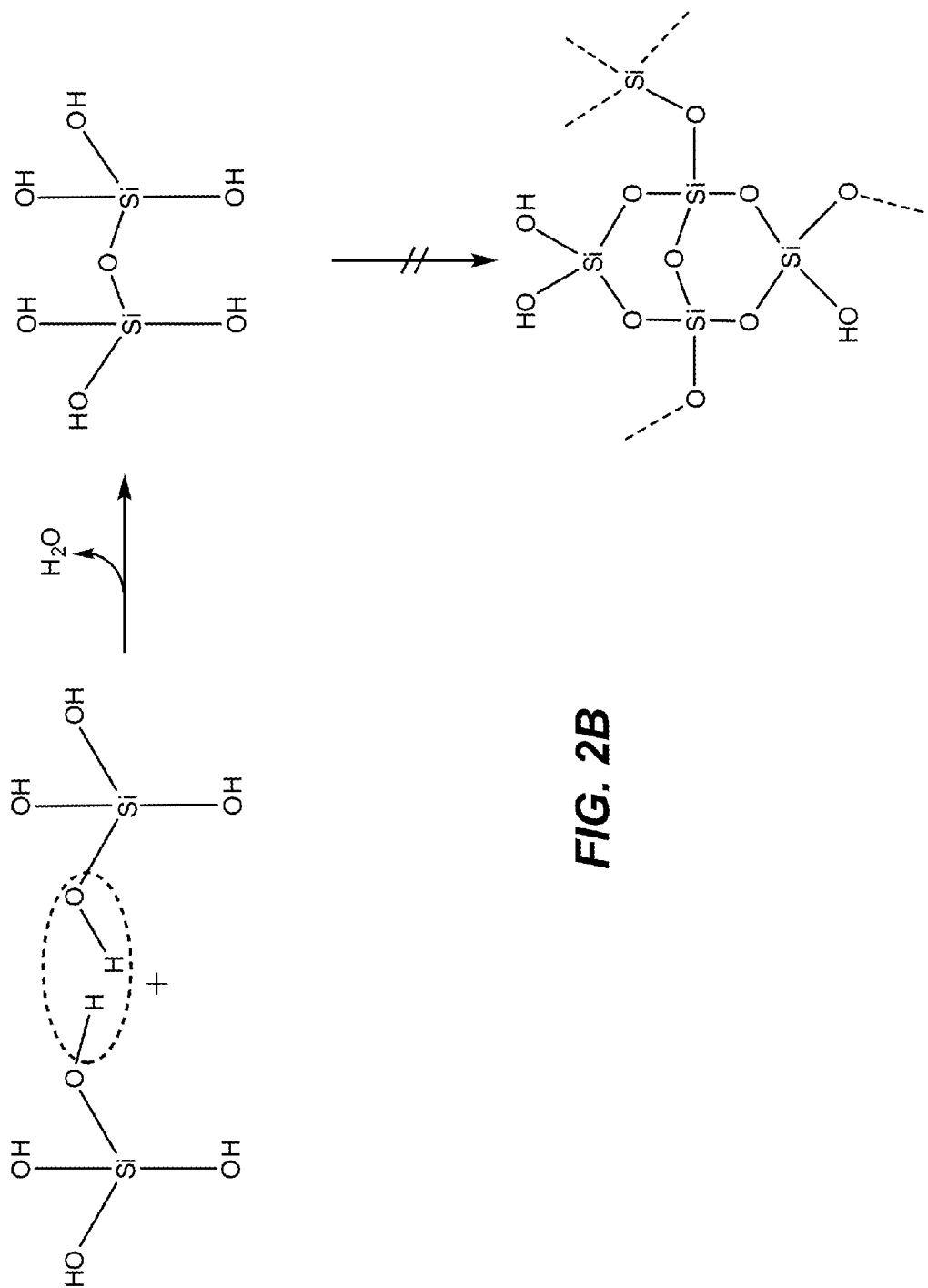

Oxolation is a reaction by which a bridging oxo group is formed through elimination of a water molecule. Two example mechanisms are provided in FIGS. 2A and 2B. In FIG. 2A, SiR$_1$(OH)$_3$ and SiR$_2$(OH)$_3$ are provided as example alkylsilanols that were generated from the hydrolysis mechanism described with respect to FIG. 1 above. The two compounds react such that a water molecule is eliminated as the —Si—O—Si— network is formed. After various cycles between silanol compounds having a variety of organic groups or —OR ligands, an example of a part of the —Si—O—Si— network is formed as shown. Note that this is a carbon-doped silicon oxide film, whereby R$_1$, R$_2$, and R$_3$ are various organic compounds. Similarly, as shown in FIG. 2B, two —Si(OH)$_3$ compounds react such that a water molecule is eliminated as the —S—O—Si— bonds are formed. FIG. 2B also shows the formation of the —Si—O—Si— network as this reaction is repeated between —other Si(OH)$_3$ groups. Note that FIGS. 2A and 2B depict some —OH groups that are unreacted. It is likely that in a condensation reaction, not all —OH groups react; however most —OH groups will react to form the —Si—O—Si— network. A generic chemical equation depicting an example of an oxolation reaction is shown in Reaction 2:

Rxn. 2

Olation is a reaction by which a bridging oxo group is formed through elimination of a solvent molecule and can occur when full coordination of Si is not achieved. In this case, bridging hydroxo groups can be formed through elimination of a solvent molecule. The latter can be either $H_2O$ or ROH depending on the water concentration in the medium.

In some embodiments, acetic acid is used as the halogen-free organic acid. The mechanism for acetic-acid catalyzed dielectric deposition may be as follows. First, a silicon-containing precursor and acetic acid may be reacted in a hydrolysis or solvolysis reaction that eliminates an alcohol molecule. This mechanism may generally map the $S_N 1$ hydrolysis mechanism describe above with respect to FIG. 1 and may be generalized in Reaction 3 below.

Rxn. 3

In some embodiments, the M-OAc resulting compound may undergo a subsequent hydrolysis reaction with the alcohol such that MOH may form, eliminating a carboxylic organic compound, as shown in Reaction 4 below.

Rxn. 4

Regardless of whether the reaction results in the M-OAc compound in Reaction 3 or the MOH compound in Reaction 4, the compound may subsequently undergo condensation using alcoxolation, oxolation, or olation mechanisms as described above. For example, an M-OAc compound may undergo the following reaction with an M-OR compound:

Rxn. 5a

As shown in Reaction 5a, the condensation reaction eliminates a carboxylic acid compound with a ligand R such that an M-O-M network is formed. In various embodiments, the metal M is silicon such that a —Si—O—Si— network is formed.

In some embodiments, the condensation reaction may occur between two M-OR compounds, resulting in the eliminating of an ether R—O—R and formation of an M-O-M network, as shown in Reaction 5b below.

Rxn. 5b

Figure 4A:
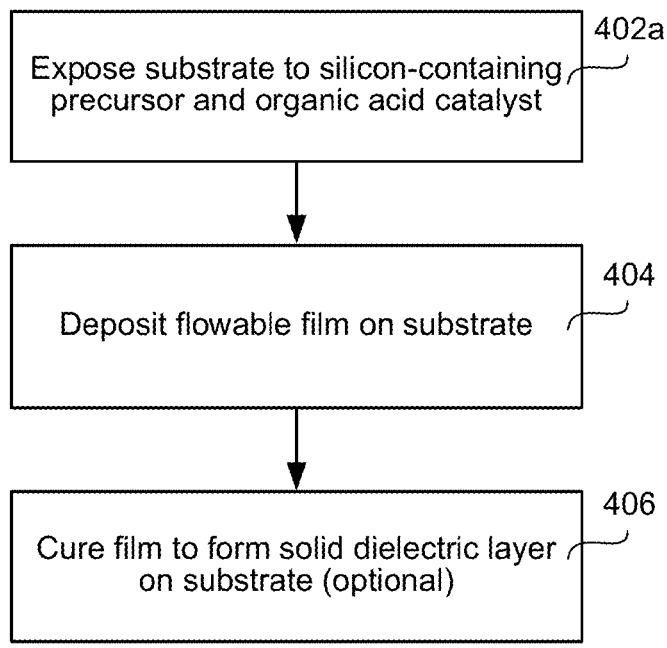
FIGS. 4A and 4B are process flow diagrams for methods of depositing films in accordance with various embodiments.

FIG. 4A is a process flow diagram for a method of depositing dielectric films in accordance with disclosed embodiments. The dielectric film is deposited on a substrate in a reaction chamber. In some implementations, the dielectric film is to be deposited in a confined space such as a pore in a porous dielectric or a gap A substrate is provided to a reaction chamber. Providing the substrate to the chamber may involve clamping the substrate to a pedestal or other support in the chamber. For this purpose, an electrostatic, vacuum, or mechanical chuck may be employed. In various embodiments, the substrate includes multiple pores and/or gaps, which may be trenches, holes, vias, etc.

In pore-filling applications, a porous film may include mesoporosity and/or microporosity. Mesoporosity generally refers to pore sizes of 2 nm-50 nm and microporosity to pore sizes less than 2 nm. In dielectrics having connected porosity, the size of at least some of the connected pores may be on a continuum with micropores having sizes on the order of Angstroms to nanometers, connected to mesopores having sizes on the order of nanometers to tens of nanometers. Although the methods may also be used to seal unconnected pores and provided smooth deposition surfaces, particular use may be found in sealing connected pores that left unsealed provide a diffusion pathway through a film. In various embodiments, the critical dimension of a pore is on the order of about 1 Å to about 1 nm.

In applications in which gaps on a substrate are to be filled (e.g., for shallow trench isolation), the critical dimension of the gap may be 1 to 50 nm, e.g., 10 to 30 nm. Critical dimension refers to the width of the pore or gap opening at its narrowest point. In certain embodiments, the aspect ratio of the gap is between 3:1 and 60:1. The substrate may be a semiconductor substrate such as silicon, silicon-on-insulator (SOI), gallium arsenide and the like, and may include metallization layers exposed on the surface of the substrate, or may be one or multiple materials. Examples of materials include nitrides, oxides, carbides, oxynitrides, oxycarbides, silicides, as well as bare silicon or other semiconductor material. Additional examples of materials used in BEOL processing include copper, tantalum, tantalum nitride, titanium, titanium nitride, ruthenium, and cobalt.

For pore-filling applications, the substrate may include a ULK film having a dielectric constant of 2.4 or less. Examples of ULK films include carbon doped oxide (CDO) films, zeolite films, and polymer films. The ULK film may include pores to be filled with the flowable dielectric. The substrate may include exposed metals, e.g., an exposed copper line.

Figure 4B:
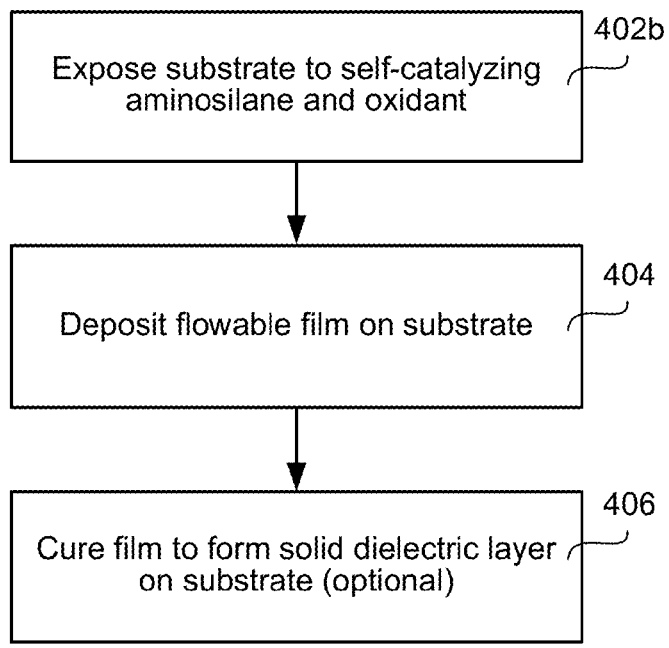

In some implementations, one or more surfaces of the substrate may be treated prior to the methods of FIGS. 4A and 4B. A pre-treatment process may be used in some implementations to enhance selectivity due to the flowable dielectric material having a shorter nucleation delay on dielectric surfaces compared to the metal surfaces. One or more pre-treatments may be used to control surface termination on substrates to enhance or block subsequent flowable dielectric deposition. In some implementations, a pre-treatment that interacts differently with porous dielectric material that is to be sealed and exposed metal surfaces, if present, is used. In this manner, selectivity of flowable dielectric deposition into pores is increased.

A pre-treatment may depend on the particular surface on which the flowable dielectric material is to be deposited or prevented from depositing. For deposition on silicon nitride and silicon oxide materials, creation of a silanol (Si—OH) termination can provide good wetting for flowable oxide deposition. In some implementations, a porous dielectric film that has undergone a k-recovery process to recover Si—C bonds that were removed during etch, may be pre-treated to change some of the recovered bonds to Si—OH terminations.

Pre-treatments to create hydrophilic surfaces to promote wetting (especially for hydrophobic dielectric precursors such as a carbon-containing dielectric precursors) are disclosed in U.S. Provisional Patent Application No. 61/895,676, incorporated by reference herein. In some implementations, the methods involve exposing the porous dielectric to an oxidizing gas, in some implementations, a hydrogen-containing oxidizing gas. However, for many pore sealing applications, there may be exposed metal surfaces that should not be oxidized. Accordingly, while oxidizing treatments may be used in some implementations to increase the wettability of certain porous materials, they may be avoided in such processes.

Examples of pre-treatments that may be useful in pore sealing applications are disclosed in U.S. patent application Ser. No. 14/464,071 titled "FLOWABLE DIELECTRIC FOR SELECTIVE ULTRA LOW-K PORE SEALING," filed concurrently herewith and incorporated herein by reference.

According to various embodiments, a pre-treatment operation may involve exposure to a plasma such as a plasma containing hydrogen, oxygen, nitrogen, helium, argon species, or some combination of these. The plasma may be downstream or in-situ, generated by a remote plasma generator, such as an Astron® remote plasma source, an inductively-coupled plasma generator or a capacitively-coupled plasma generator. In some implementations, the pre-treatment may avoid in situ plasmas to avoid damaging the porous dielectric layer. In alternate embodiments, the pretreatment operation involves exposing the substrate to the pre-treatment chemistry in a non-plasma environment. The particular process conditions may vary depending on the implementation. In some of these embodiments, the substrate may be exposed to the pre-treatment chemistry in the presence energy from another energy source, including a thermal energy source, a ultraviolet source, a microwave source, etc. In certain embodiments, in addition to or instead of the pre-treatment operations described above, a substrate is pretreated with exposure to a catalyst, surfactant, or adhesion-promoting chemical. The pre-treatment operation, if performed, may occur in the deposition chamber or may occur in another chamber prior to transfer of the substrate to the deposition chamber.

Returning to FIG. 4A, in operation 402a, the substrate is exposed to a silicon-containing precursor and a halogen-free organic acid catalyst. In various embodiments, the substrate is also exposed to an oxidant. Sometimes, though not necessarily, an inert carrier gas is present. In certain embodiments, the gases are introduced using a liquid injection system. In certain embodiments, the silicon-containing precursor and the oxidant may be introduced via separate inlets or are combined just prior to introduction into the chamber in a mixing bowl and/or showerhead. As discussed further below, the catalyst and/or optional dopant may be incorporated into one of the reactants, pre-mixed with one of the reactants or introduced separately. A solvent or other surfactant may also be added to the process gas. In some embodiments, the substrate is exposed to the precursor and catalyst while the substrate is exposed to UV radiation.

In certain embodiments, the silicon-containing precursor is an alkoxysilane. Alkoxysilanes that may be used include, but are not limited to, the following:

$H_x$—Si—$(OR)_y$ where x=0-3, x+y=4 and R is a substituted or unsubstituted alkyl group;

$R'_x$—Si—$(OR)_y$ where x=0-3, x+y=4, R is a substituted or unsubstituted alkyl group and R' is a substituted or unsubstituted alkyl, alkoxy or alkoxyalkane group; and $H_x(RO)_y$—Si—Si—$(OR)_y H_x$ where x=0-2, x+y=3 and R is a substituted or unsubstituted alkyl group.

Examples of silicon-containing precursors include $CH_3Si(OCH_2)_3$; 1-(triethoxysilyl)-2-(diethoxymethylsilyl)ethane, 1,2,3,4,5,6-hexamethoxy-1,2,3,4,5,6-hexamethylcyclohexasilane; 1,2-dimethoxy-1,1,2,2-tetramethyldisilane; 1,4-dioxa-2,3,5,6-tetrasilacyclohexane; bis-triethoxysilylethane (BTEOSE); bis-triethoxysilylmethane (BTEOSM); butasilanes; cyclobutasilane; cycloheptasilane; cyclohexasilane; cyclooctasilane; cyclopentasilane; decabutaoxycyclopentasilane; diethoxymethylsilane (DEMS); diethoxysilane (DES); dimethoxymethylsilane; dimethoxysilane (DMOS); dimethyldiethoxysilane (DMDEOS); dimethyldimethoxysilane (DMDMOS); disilane; dodecamethoxycyclohexasilane; ethylsilane; heptasilane; hexaethoxydisilane (HEODS); hexaethoxydislazoxane (HEDS-H); hexamethoxydislazoxane (HMODS); hexamethoxydisilazoxane (HMDS-H); hexamethoxydisiloxane; hexasilane; hydrogen silsesquioxane; methyl hexamethoxydisilazoxane (HMDS-CH$_3$); methyl-diethoxysilane (MDES); methyl-dimethoxysilane (MDMS); methylsilane; methyltriethoxyorthosilicate (MTEOS); methyl-triethoxysilane (MTES); methyltrimethoxysilane (MTMOS); methyl-trimethoxysilane (MTMS); non-amethoxytrisilazoxane (NMTS); octaethoxycyclobutasilane; OctaHydro POSS™ (Polyhedral Oligomeric Silsesquioxane); octamethoxycyclicsilazoxane (OMCS); octamethoxydodecasiloxane (OMODDS); octamethoxytrisiloxane (OMOTS); octamethyl-1,4, dioxa-2,3,5,6-tetrasilacyclohexane; octamethylcyclotetrasiloxane (OMCTS); octasilanes; pentasilanes; silane (SiH$_4$); T8-hydridospherosiloxane; tert-butoxydisilane; tetraacetoxysilane (Si(OAc)$_4$); tetraethoxysilane (TEOS); tetraisocyanatesilane (TICS); tetramethoxy silane; tetramethoxysiloxane (TMOS); tetramethylcyclotetrasiloxane (TMCTS); tetramethylorthosilicate (TMOS); tetramethylsilane (4MS); tetraoxymethylcyclotetrasiloxane (TOMCTS); tetravinyltetramethylcyclotetrasiloxane (TVTMCTS); triacetoxysilane (SiH(OAc)$_3$); triethoxysilane (TES); triethoxysiloxane (TRIES); trimethoxymethylsilane (TMOMS); trimethoxysilane (TMS or TriMOS); trimethylmethoxysilane (TMMOS); trimethylsilane (3MS); triphenylethoxysilane; trisilane; and tri-t-butoxylsilanol. Further examples of silicon containing precursors include, but are not limited to, silane (SiH$_4$), disilane, trisilane, hexasilane, cyclohexasilane, and alkylsilanes, e.g., methylsilane, and ethylsilane.

In certain embodiments, carbon-doped silicon precursors are used, either in addition to another precursor (e.g., as a dopant) or alone. Carbon-doped precursors can include at least one Si—C bond. Carbon-doped precursors that may be used include, but are not limited to the, following:

R'$_x$—Si—R$_y$ where x=0-3, x+y=4, R is a substituted or unsubstituted alkyl group and R' is a substituted or unsubstituted alkyl, alkoxy or alkoxyalkane group; and SiH$_x$R'$_y$—R$_z$ where x=1-3, y=0-2, x+y+z=4, R is a substituted or unsubstituted alkyl group and R' is a substituted or unsubstituted alkyl, alkoxy or alkoxyalkane group.

Examples of carbon-doped precursors are given above with further examples including, but not being limited to, trimethylsilane (3MS), tetramethylsilane (4MS), diethoxymethylsilane (DEMS), dimethyldimethoxysilane (DMDMOS), methyl-triethoxysilane (MTES), methyl-trimethoxysilane, methyl-diethoxysilane, methyl-dimethoxysilane, trimethoxymethylsilane, (TMOMS), dimethoxymethylsilane, and bis(trimethylsilyl)carbodiimide.

In certain embodiments aminosilane precursors are used. Aminosilane precursors include, but are not limited to, the following: H$_x$—Si—(NR)$_y$ where x=0-3, x+y=4 and R is an organic of hydride group.

Examples of aminosilane precursors are given above, with further examples including, but not being limited to -tert-butylamino silane (BTBAS) or tris(dimethylamino)silane.

The halogen-free organic acid catalyst may be a proton donor having a pH between about 1 and about 7, with a pKa between about 1 and about 6. A good proton donor may be a compound that can give up its proton/H+ easily, which results in a higher reaction rate. The pKa is correlated with the speed of the reaction due to the catalyzing nature of the organic acid.

Halogen-free organic acid catalysts include 1) acids including nitric, phosphoric, sulfuric acids; and 2) carboxylic acid derivatives including R—COOH where R is substituted or unsubstituted alkyl, aryl, acetyl or phenol, as well as R—COOC—R carboxylic anhydrides. These carboxylic acid derivatives may have structures such as the following generic organic structures:

Examples of halogen-free organic acid catalysts include ethylenediaminetetraacetic acid (C$_{10}$H$_{16}$N$_2$O$_8$), picric acid (C$_6$H$_3$N$_3$O$_7$), and acetic acid (CH$_3$COOH):

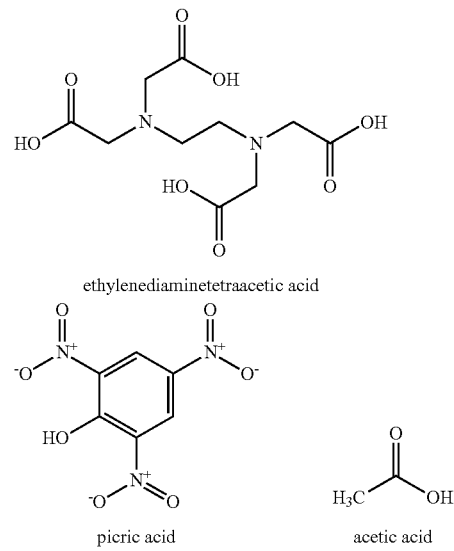

Further examples of organic acids that could be used as catalysts include, but are not limited to, tartaric acid (C$_4$H$_6$O$_6$), citric acid (C$_6$H$_8$O$_7$), formic acid (HCOOH), oxalic acid (HO$_2$CCO$_2$H), sulfonic acids (RS(=O)$_2$—OH), benzoic acid (C$_6$H$_5$CO$_2$H), methanesulfonic acid (CH$_3$SO$_3$H), any other substituted derivatives of these acids, or combinations thereof. Some other nonorganic acids could be used in some embodiments, including pyrophosphoric acid (H$_4$P$_2$O$_7$), phosphoric acid (H$_3$PO$_4$), and sulfuric acid (H$_2$SO$_4$). In some embodiments, a fluorine-containing organic acid may be suitable for use, such as triflic acid (CF$_3$SO$_3$H), or trifluoroacetic acid (CF$_3$CO$_2$H), but note that fluorine anions may cause contamination and degradation in the substrate and so may be avoided in other embodiments. In various embodiments, the halogen-free organic acid is photosensitive. A photosensitive catalyst may be identified by comparison of shrinkage (or other cure characteristic) of a film in dark conditions versus under light. For example, an optical mask pattern applied to an uncured flowable oxide film can be translated to the oxide's thickness profile. Preliminary data from deposition with acetic acid shows photosensitivity with 38%-45% less shrinkage being observed after thermal cure for wafers kept in the dark compared to control wafers left out under cleanroom fluorescent light. No such behavior is observed for identical tests with chloride catalyzed deposited films. In embodiments where operation 402a is performed while the substrate is exposed to UV radiation and a photosensitive halogen-free organic acid is used, the reaction rate may be increased.

Examples of oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$).

According to various embodiments, catalysts and other reactants may be introduced simultaneously or in particular sequences. For example, in some embodiments, an acidic compound may be introduced into the reactor to catalyze the hydrolysis reaction at the beginning of the deposition process, and then a basic compound may be introduced near the end of the hydrolysis step to inhibit the hydrolysis reaction and then catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

Other possible reactions involving bi-, tri- and tetra-acid catalysts involve ligand exchanges that result in formation of chelated intermediate compounds or transition states that ultimately hydrolyze and condense to yield the desired oxide network. However, these compounds may condense more slowly than monodentate intermediates.

Conditions in the chamber during operation 402a are such that the silicon-containing compound and the oxidant react to form a flowable film on the substrate. Formation of the film is aided by presence of the catalyst. The method may not be limited to a particular reaction mechanism, e.g., the reaction mechanism may involve a condensation reaction, a vapor-phase reaction producing a vapor-phase product that condenses, condensation of one or more of the reactants prior to reaction, or a combination of these.

Reactions conditions can be such that the silicon-containing compound and co-reactant undergo a condensation reaction, condensing on the substrate surface to form a flowable film. In certain embodiments, the reaction takes place in dark or non-plasma condition i.e., the substrate is not exposed to a plasma during the deposition phase (operations 402a and 404) of the process. In other embodiments, the reaction takes place in the presence of a plasma, generated either remotely or in the deposition chamber. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1 and 200 Torr, in certain embodiments, it is between 10 and 75 Torr. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature.

Precursor partial pressure ratio($Pp/Pvp$)=0.01–1, e.g., 0.01–0.5

Oxidant partial pressure ratio($Pp/Pvp$)=0.25–2, e.g., 0.5–1

Solvent partial pressure ratio($Pp/Pvp$)=0–1, e.g, 0.1–1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:

Oxidant: Precursor partial pressure ratio($Pp_{oxidant}/Pp_{precursor}$)=0.2–30, e.g., 5-15

Solvent: Oxidant partial pressure ratio($Pp_{solvent}/Pp_{oxidant}$)=0–30, e.g., 0.1-5

In certain embodiments, the process gas is characterized by an oxidant: precursor partial pressure ratio of between about 5 and 15 and a solvent:oxidant partial pressure ration of between about 0.1 and 5.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may involve increasing pressure. In one embodiment, the temperature is about 5° C. and the pressure about 10 Torr. Exposure time depends on reaction conditions as well as pore size. Deposition rates are from about 100 angstroms/min to 1 micrometer/min according to various embodiments. The substrate is exposed to the reactants under these conditions for a period long enough to deposit a flowable film in the pores. In certain embodiments, deposition time is 0.1-5 seconds.

The amount of condensation is controlled by the reactants' partial pressures relative to their saturated vapor pressures (which are constant for a given deposition temperature). The dependence of fill rate on critical dimension can be tuned by varying the partial pressures. In this manner, selectivity can be tuned, improving the capability to deposit in just the pores or as otherwise desired. For example, at low enough partial pressure of the dielectric precursor, there is no condensation or deposition in features of any size. As the partial pressure is increased, the dielectric precursor condenses in small features, with deposition occurring in increasingly larger feature sizes as the partial pressure is increased. In this manner, it may be possible to, for example, prevent deposition in a 20 nm etched trench of a ULK film while allowing deposition in the pores of the ULK film.

In some implementations, a continuous film may be allowed to deposit on the surface of a porous dielectric film. As such, the partial pressure is controlled to allow formation of the film in the critical dimension of the trench. According to various implementations, the partial pressure may be constant at an appropriate level or raised after deposition in the pores. In some implementations, a termination agent such as a silylation agent may be introduced to terminate the surface and stop the reaction. Examples include (dimethylamino) trimethylsilane, which may methyl-terminate the surface and stop the reaction. Further details of a pore-sealing processes are provided in U.S. patent application Ser. No. 14/464,071 titled "FLOWABLE DIELECTRIC FOR SELECTIVE ULTRA LOW-K PORE SEALING," filed concurrently herewith and incorporated herein by reference.

As shown in an operation 404, a flowable film is thereby deposited on the substrate surface. In pore and gap filling applications, the substrate is exposed to the process gases for a period sufficient to deposit a flowable film to fill at least some of the pores or gaps. The deposition process typically forms soft jelly-like film with good flow characteristics, providing consistent fill. The methods are not limited to gap or pore filling, however, and may also be used to deposit blanket films. For example, as noted above, a continuous film may be allowed to form on the surface of a porous dielectric.

After the flowable film has been deposited on the substrate, the as-deposited flowable film is optionally cured to form the desired dielectric layer in an operation 406. In some implementations, the film is first exposed to plasma species while it is still in a flowable, reactive state. As discussed in U.S. Provisional Patent Application No. 61/895,883, exposure to a plasma generated, for example, from a process gas having a primary component of hydrogen (H2), helium (He), nitrogen (N2) or argon (Ar). In such cases, the plasma exposure generally will take place at substantially the same temperature as the deposition such that the film does not undergo thermal-activated solidification. Such plasma exposure may be effective to densify the flowable film in the pore if the film is still in a flowable state. In some embodiments, the plasma exposure is effective to drive the overall deposition reaction closer to completion to form the flowable film.

In addition to or instead of exposing the film while it is in a thermal reactive state, block 406 of FIG. 4 may be performed. In some embodiments block 406 may involve a post-deposition cure that may take place at a much higher temperature than the deposition temperature. Such a cure may further cross-linking, and remove terminal groups such as —OH and —H groups in the film, and further increase the density and hardness of the film. Depending on the film composition, the cure may also shrink the film.

The film may be cured by purely thermal anneal, exposure to a downstream or direct plasma, exposure to ultraviolet or microwave radiation or exposure to another energy source. Thermal anneal temperatures may be 300° C. or greater (depending on the allowable thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) can be used and can incorporate a certain amount of nitrogen in the film. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an Si(OH)x as-deposited gel is converted to a SiO network using an oxidizing plasma cure. In other embodiments, an Si(OH)x as-deposited gel is converted to a SiON network. In other embodiments, an Si(NH)x as-deposited gel is converted to an SiON network.

In certain embodiments, the film is cured by exposure to a plasma, either remote or direct (inductive or capacitive). This may result in a top-down conversion of the flowable film to a densified solid film. The plasma may be inert or reactive. Helium and argon plasma are examples of inert plasmas; oxygen and steam plasmas are examples of oxidizing plasmas (used for example, to remove carbon as desired). Hydrogen-containing plasmas may also be used. An example of a hydrogen-containing plasma is a plasma generated from a mix of hydrogen gas (H2) and a diluent such as inert gas. Temperatures during plasma exposure are typically about 25° C. or higher. In certain embodiments, an oxygen or oxygen-containing plasma is used to remove carbon. In some embodiments, temperature during plasma exposure can be lower, e.g., −15° C. to 25° C.

Temperatures during cures may range from 0-600° C., with the upper end of the temperature range determined by the thermal budget at the particular processing stage. In certain embodiments, the temperatures range from about 200° C.-550° C. Pressures may be from 0.1-10 Torr, with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as $N_2$, $O_2$, $H_2O$, Ar and He. In certain embodiments, an ex situ treatment involves exposing the film to ultraviolet radiation, e.g., in an ultraviolet thermal processing (UVTP) process. For example, temperatures of 100° C., or above, e.g., 100° C.-400° C., in conjunction with UV exposure may be used to cure the film. Other flash curing processes, including RTP or laser anneal, may be used as well.

In some embodiments, operation 406 is not performed. In some embodiments, the deposited film undergoes post-treatment with excess oxidant, such that the oxidant, such as water, continuously flows into the chamber to react with the deposited flowable film. This post-treatment may allow the reactions to continue to form —Si—O—Si— bonds by removing any remaining ligands.

Due to the photosensitivity of various organic acid catalysts, the photolysis effect may help catalyze the hydrolysis and condensation of the compounds to form the flowable film such that the subsequent processing in operation 406 is mitigated or eliminated. As such, a flowable film deposited using a photosensitive catalyst and light may not require substantial post-processing to purify the —Si—O—Si— network. For example, a thermal cure may be used in place of a UV cure. An alkoxysilane reaction with organic acids in the absence of oxygen may yield photoluminescent materials by introducing carbon impurities in the silica network. The thickness and shrinkage modulation by exposure to light suggests that the films deposited are photosensitive and may affect the mechanism of the hydrolysis reaction. In some embodiments, a metastable transient phase, which may be a chelate complex, may form in the reaction between the silicon-containing precursor and photosensitive catalyst.

Self-Catalyzing Silanes

Deposition of silicon oxide dielectric films into pores or gaps may be catalyzed by a self-catalyzing silane which undergoes hydrolysis and condensation reactions. Various self-catalyzing silanes may be aminosilanes. In some implementations, aminosilanes having one or more secondary amines are used.

Figure 3:
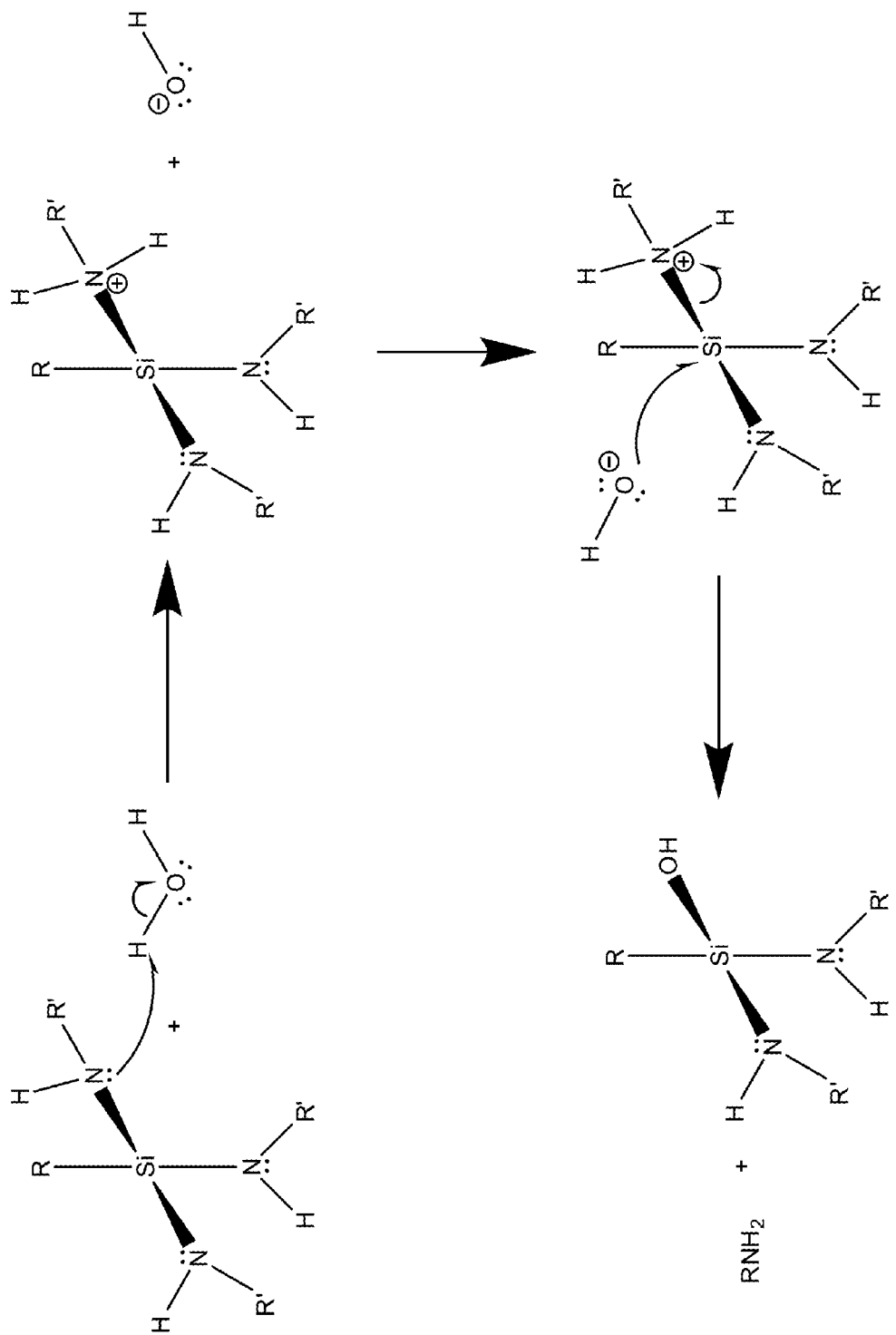

FIG. 3 shows an example of a reaction mechanism for the hydrolysis of a self-catalyzing silylamine. In the first step, electrons from the nitrogen in one of the amino groups bond with a hydrogen atom on a water molecule, thereby resulting in the protonation of an —$NH_2R'$ ligand and the formation of a negative —OH hydroxide group. The intermediate state has a hydrogen atom bound to the nitrogen of the —NHR' ligand, thereby forming a slightly positive —$NH_2R'$ amino group. In the next step, a concerted nucleophilic $S_N1$ attack by a —OH hydroxide group occurs on the silicon center of the compound, along with the cleaving of the $NH_2R$ amino leaving group. The last step shows a released $R'NH_2$ amino compound and $SiR(NHR')_2OH$. The steps may be repeated for each of the —NHR' groups on the silane to form $Si(OH)_3R$. In some embodiments, one or more ligands on the self-catalyzing silane may not react. The significance of the self-catalyzing silane is that the compound has the catalyzing groups already attached to the silane, such that the aminosilane can undergo hydrolysis with water or a proton donor to form the desired intermediate prior to condensation.

Amines are hydrolyzable in water, creating a silanol-rich product in a basic medium (e.g., pH>7) leading to a rapidly catalyzed condensation to give the desired oxide network. The proliferating Si—OH groups proceed to polycondense and form an —Si—O—Si— network with an $H_2O$ molecule given off as a co-product with each condensation reaction. By selecting the appropriate self-catalyzing silane, no nitrogen would remain in the resulting sol-gel film as the ammonia or alkyl-amine would be emitted during the deposition process and removed as a by-product.

The resulting silanol-rich product may undergo a condensation mechanism to form an —Si—O—Si— network. The condensation mechanism may be the condensation mechanism described above with respect to FIG. 2A or the condensation mechanism described above with respect to FIG. 2B. In some embodiments, some organic ligands on the silanol compound may remain bonded to the silane throughout condensation to yield a carbon-doped silicon oxide compound. Condensation mechanisms may include alcoxolation, oxolation, olation, or any combination of these.

FIG. 4B is a process flow diagram for a method of depositing dielectric films in accordance with disclosed embodiments. A substrate containing gaps or pores is provided to a reaction chamber or chamber. The substrate may be provided to the chamber using any method described above with respect to FIG. 4A.

In operation 402b, the substrate is exposed to a self-catalyzing silane and an oxidant. Sometimes, though not necessarily, an inert carrier gas is present. In certain embodiments, the gases are introduced using a liquid injection system. In certain embodiments, the silicon-containing compound and the oxidant can be introduced via separate inlets or are combined just prior to introduction into the chamber in a mixing bowl and/or showerhead. As discussed further below, the catalyst and/or optional dopant may be incorporated into one of the reactants, pre-mixed with one of the reactants or introduced separately. An alcohol may also be added to the process gas.

Examples of self-catalyzing silanes include aminosilanes. Aminosilanes that may be used include, but are not limited to, the following generic chemical formula: $H_x$—Si—$(NR)_y$, where x=0-3, x+y=4 and R is an organic hydride group. For example, the structure of a self-catalyzing silane may be as follows:

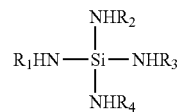

In the structure above, R1, R2, R3, and R4 may be same or different N-alkylamines. Some self-catalyzing silanes may have at least one N-alkylamine linked or coordinated directly with the silicon with other organic functional groups forming linkages with the silicon. Different ligands can be chosen up to a total of 4 (including the alkylamine group). Some examples of the different ligands that can be chosen are: N-alkyl amine; N,N dialkyl amine; alkoxy; alkyl; alkenyl; alkynyl; aromatic groups; and hydrogen.

Examples of self-catalyzing silanes include aminosilanes such as dimethylamino trimethylsilane, dimethylaminotriethylsilane and bisdimethylaminodiethylsilane:

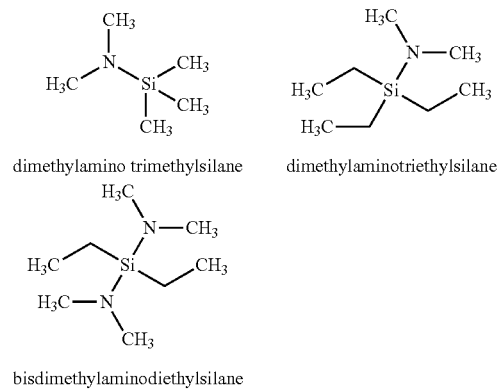

Further examples of self-catalyzing silanes include, but are not limited to, 1,1,1,3,3,3-hexamethyldisilazane $(CH_3)_3SiN(H)Si(CH_3)_3$ (HDMS); bis(diethylamino)silane; bis(trimethylsilyl)carbodiimide; bis-tert-butylamino silane (BTBAS); cyclic azasilanes; hexamethyldisilazane (HMDS); methylsilatrane; silatrane; tert-butylamino silane (BTBAS); tetrakis(dimethyl)amino)silane; tris(dimethylamino)silane; trisilylamine (TSA); trisdimethylamino methylsilane; trisdimethylamino silane; trismethylamino methylsilane; trismethylamino silane; bisdimethylamino dimethylsilane; bisdimethylamino ethoxy methyl silane; methylamino diethoxy methyl silane; trismethylamino vinyl silane; bismethylamino divinyl silane; bisdimethylamino ethoxy vinyl silane; acetoxysilanes; and combinations thereof.

In some embodiments, acetoxy silanes may be used as silicon-containing precursors. In some embodiments, the reaction may begin with the deposition of an acetoxy-based precursor, followed by an amine-based catalyst or aminosilane, such as any of those describe above. Example acetoxy-based precursors include, but are not limited to, tetraoxysilane and siloxane:

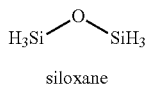
siloxane

Examples of oxidants include any of those described above with respect to FIG. 4A. In certain embodiments, a remote plasma generator may supply activated oxidant species. One or more dopant precursors, catalysts, inhibitors, buffers, surfactants, solvents and other compounds may be introduced.

The self-catalyzing silane may be introduced with the oxidant simultaneously or in particular sequences. In some embodiments, solvents may be used. Solvents may have any of the characteristics and may be any of those described above with respect to organic acid catalyzed flowable films. In some embodiments, an inert carrier gas is present. Any of the reactants used in operation 402a of FIG. 4A or operation 402b of FIG. 4B (self-catalyzing silane, silane-containing precursor, oxidant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

In some implementations, an aminosilane may also be used as a k-recovery agent to treat a ULK or other low-k film prior or concurrent with operation 404. K-recovery agents are discussed in U.S. patent application Ser. No. 14/464,071 titled "FLOWABLE DIELECTRIC FOR SELECTIVE ULTRA LOW-K PORE SEALING," filed concurrently herewith and incorporated herein by reference The process gases for the self-catalyzing silane and the oxidant as well as solvent may be introduced with partial pressures such as those describe above with respect to FIG. 4A. The exposure times and chamber pressures and temperatures may also be any of those described above with respect to FIG. 4A.

As shown in operation 404 of FIG. 4B, a flowable film is thereby deposited on the substrate surface. The flowable film may be deposited to a thickness as describe above with respect to FIGS. 4A and 4B at a deposition rate similar to that of the deposition rate described above. In many embodiments, the flowable film may still include some residual amine groups. In various embodiments, the flowable film may be a carbon-doped silicon oxide film.

In operation 406, the deposited film may be cured using any of the techniques or methods described above with respect to FIG. 4A. In some embodiments, an —OH peak in the FTIR may appear due to amine groups, which were still remaining on the precursor that were not hydrolyzed or cured, reacting with oxygen in the air. However, since fewer —OH groups in the deposited film prior to cure, the UV cure operation may be shortened or eliminated. If a UV cure is implemented, the UV cure will remove all remaining amine groups. In some embodiments, the deposited film undergoes post-treatment with excess oxidant to continue to form —Si—O—Si— bonds by removing any remaining ligands such as amine groups. In various embodiments, operation 406 may not be performed depending on the self-catalyzing silane used to deposit the flowable film. In some embodiments, only a thermal cure is performed in operation 406.

In some embodiments, a UV cure is not used. In particular, where a secondary amine is used as a self-catalyzing silane, the solvent reacts with the secondary amine such that —OH are mostly eliminated, and therefore, a thermal anneal may be used to remove any remaining —OH groups. Thermal anneal temperatures may be 300° C. or greater (depending on the allowable thermal budget). The treatment may be performed in an inert environment (Ar, He, etc.) or in a potentially reactive environment. A tertiary amine reaction with a solvent as described herein may form a film with ligands that may not be removable using only a thermal cure or anneal. A UV cure may then be used to remove —OH groups where a tertiary amine reacts with the solvent.

Apparatus

The methods of the present invention may be performed on a wide-range of modules. The methods may be implemented on any apparatus equipped for deposition of dielectric film, including HDP-CVD reactors, PECVD reactors, sub-atmospheric CVD reactors, any chamber equipped for CVD reactions, and chambers used for PDL (pulsed deposition layers).

Such an apparatus may take many different forms. Generally, the apparatus will include one or more modules, with each module including a chamber or reactor (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate.

Figure 5:
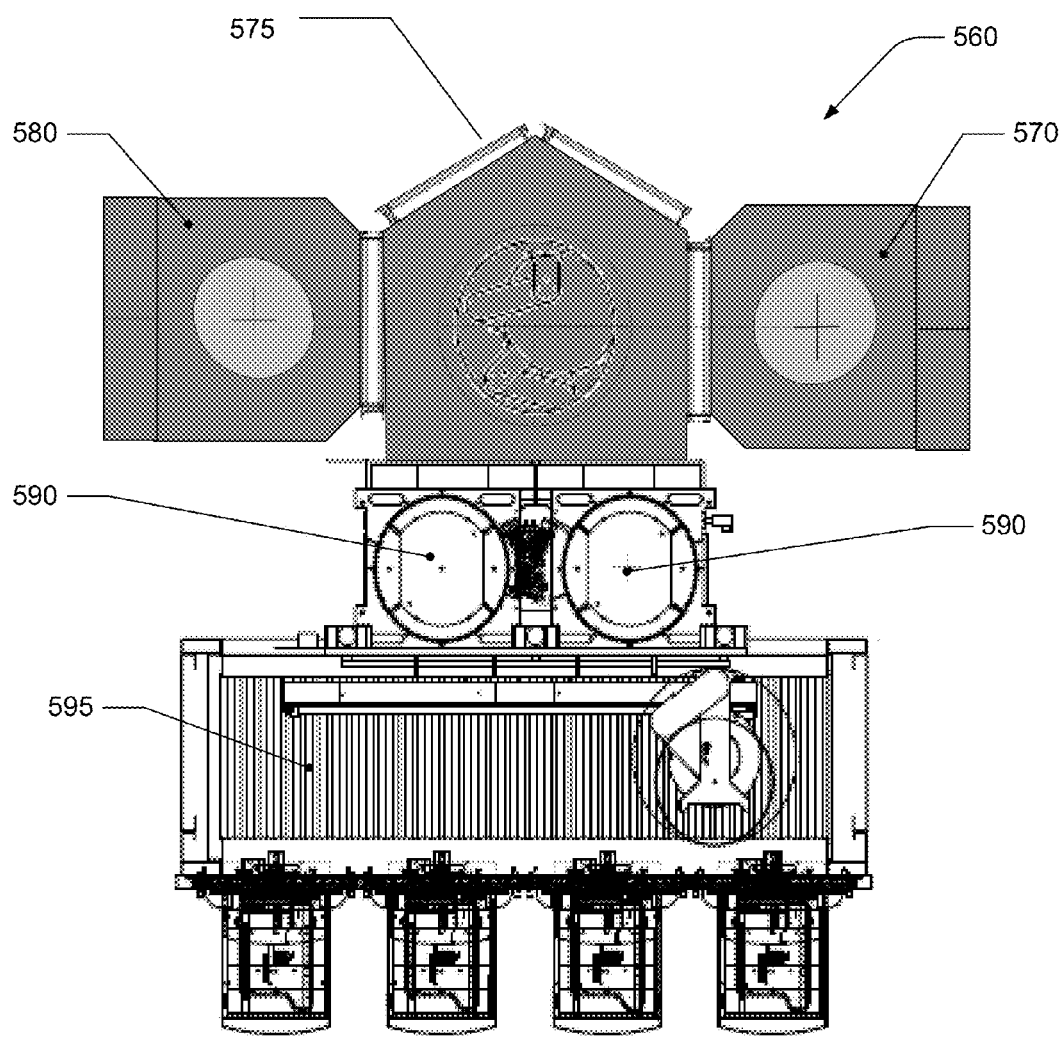
FIG. 5 is a schematic depiction of an apparatus for performing operations in accordance with various embodiments.

In performed, a pre-treatment may take place in the same or different module as the flowable dielectric deposition. FIG. 5 shows an example tool configuration 560 including wafer transfer system 595 and loadlocks 590, flowable deposition module 570, and a pre-deposition treatment module 580. Additional modules, such as a post-deposition treatment module, and/or one or more additional deposition modules 570 or cure modules 580 may also be included.

Modules that may be used for pre-treatment or cure include SPEED or SPEED Max, NOVA Reactive Preclean Module (RPM), Altus ExtremeFill (EFx) Module, Vector Extreme Pre-treatment Module (for plasma, ultra-violet or infra-red pre-treatment or cure), SOLA (for UV pre-treatment or cure), and Vector or Vector Extreme modules. These modules may be attached to the same backbone as the flowable deposition module. Also, any of these modules may be on different backbones. A system controller may be connected to any or all of the components of a tool; its placement and connectivity may vary based on the particular implementation. An example of a system controller is described below with reference to FIG. 7.

Figure 6:
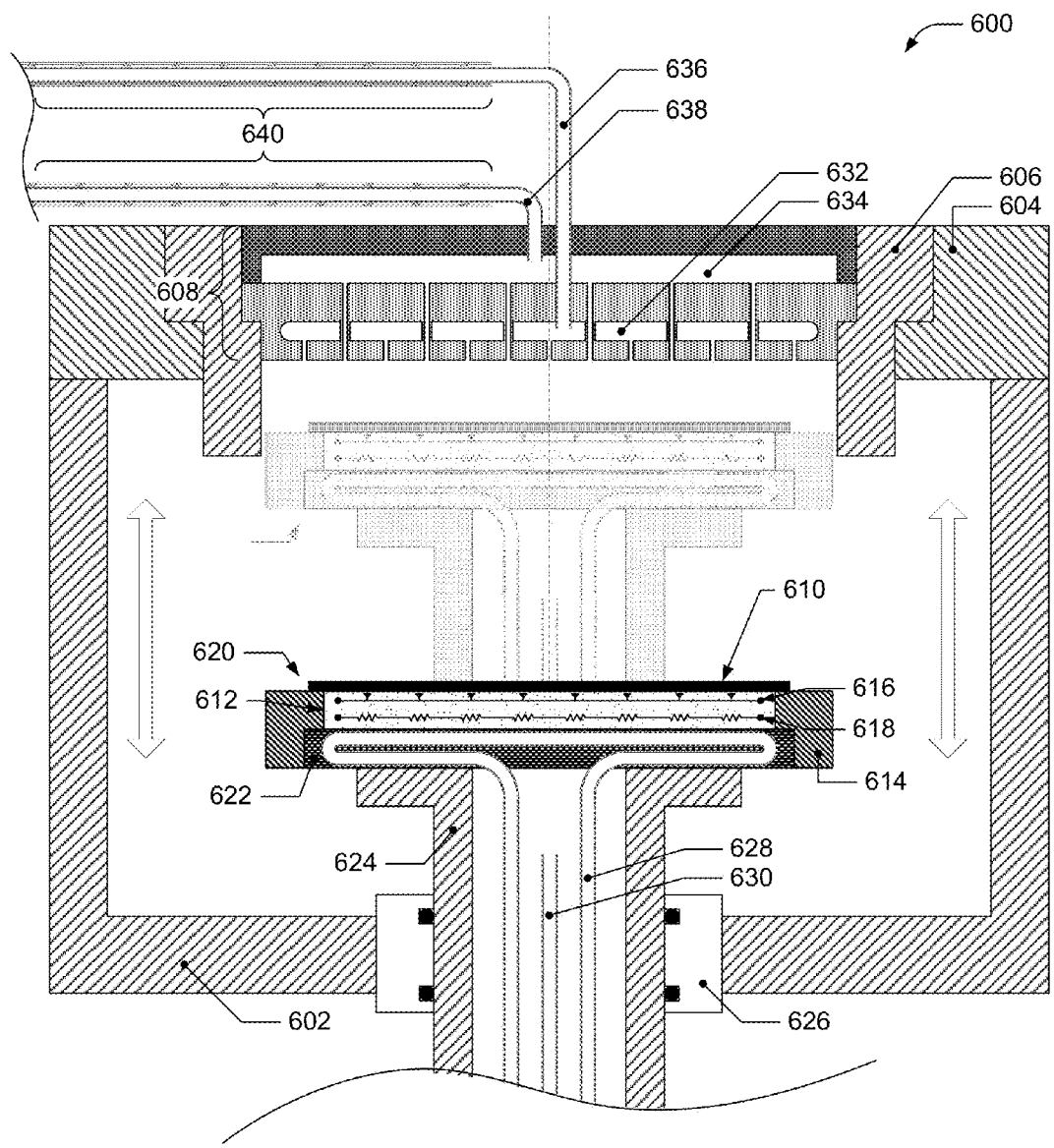
FIGS. 6 and 7 are schematic depictions of chambers for practicing various methods in accordance with various embodiments.

FIG. 6 shows an example of a deposition chamber for flowable dielectric deposition. A deposition chamber 600 (also referred to as a reactor, or reactor chamber) includes chamber housing 602, top plate 604, skirt 606, showerhead 608, pedestal column 624, and seal 626 provide a sealed volume for flowable dielectric deposition. Wafer 610 is supported by chuck 612 and insulating ring 614. Chuck 612 includes RF electrode 616 and resistive heater element 618. Chuck 612 and insulating ring 614 are supported by pedestal 620, which includes platen 622 and pedestal column 624. Pedestal column 624 passes through seal 626 to interface with a pedestal drive (not shown). Pedestal column 624 includes platen coolant line 628 and pedestal purge line 630. Showerhead 608 includes co-reactant-plenum 632 and precursor-plenum 634, which are fed by co-reactant-gas line 636 and precursor-gas line 638, respectively. Co-reactant-gas line 636 and precursor-gas line 638 may be heated prior to reaching showerhead 608 in zone 640. While a dual-flow plenum is described herein, a single-flow plenum may be used to direct gas into the chamber. For example, reactants may be supplied to the showerhead and may mix within a single plenum before introduction into the reactor. 620' and 620 refer to the pedestal, but in a lowered (620) and raised (620') position.

The chamber is equipped with, or connected to, gas delivery system for delivering reactants to reactor chamber 600. A gas delivery system may supply chamber 610 with one or more co-reactants, such as oxidants, including water, oxygen, ozone, peroxides, alcohols, etc. which may be supplied alone or mixed with an inert carrier gas. The gas delivery system may also supply chamber with one or more dielectric precursors, for example triethoxysilane (TES), which may be supplied alone or mixed with an inert carrier gas. The gas delivery system is also configured to deliver one or more treatment reagents, for plasma treatment as described herein reactor cleaning. For example, for plasma processing, hydrogen, argon, nitrogen, oxygen or other gas may be delivered.

Deposition chamber 600 serves as a sealed environment within which flowable dielectric deposition may occur. In many embodiments, deposition chamber 600 features a radially symmetric interior. Reducing or eliminating departures from a radially symmetric interior helps ensure that flow of the reactants occurs in a radially balanced manner over wafer 610. Disturbances to the reactant flows caused by radial asymmetries may cause more or less deposition on some areas of wafer 610 than on other areas, which may produce unwanted variations in wafer uniformity.

Deposition chamber 600 includes several main components. Structurally, deposition chamber 600 may include a chamber housing 602 and a top plate 604. Top plate 604 is configured to attach to chamber housing 602 and provide a seal interface between chamber housing 602 and a gas distribution manifold/showerhead, electrode, or other module equipment. Different top plates 604 may be used with the same chamber housing 602 depending on the particular equipment needs of a process.

Chamber housing 602 and top plate 604 may be machined from an aluminum, such as 6061-T6, although other materials may also be used, including other grades of aluminum, aluminum oxide, and other, non-aluminum materials. The use of aluminum allows for easy machining and handling and makes available the elevated heat conduction properties of aluminum.

Top plate 604 may be equipped with a resistive heating blanket to maintain top plate 604 at a desired temperature. For example, top plate 604 may be equipped with a resistive heating blanket configured to maintain top plate 604 at a temperature of between −20° C. and 100° C. Alternative heating sources may be used in addition to or as an alternative to a resistive heating blanket, such as circulating heated liquid through top plate 604 or supplying top plate 604 with a resistive heater cartridge.

Chamber housing 602 may be equipped with resistive heater cartridges configured to maintain chamber housing 602 at a desired temperature. Other temperature control systems may also be used, such as circulating heated fluids through bores in the chamber walls. The chamber interior walls may be temperature-controlled during flowable dielectric to a temperature between −20° C. and 100° C. In some implementations, top plate 604 may not include heating elements and may instead rely on thermal conduction of heat from chamber resistive heater cartridges to maintain a desired temperature. Various embodiments may be configured to temperature-control the chamber interior walls and other surfaces on which deposition is undesired, such as the pedestal, skirt, and showerhead, to a temperature approximately 10° C. to 40° C. higher than the target deposition process temperature. In some implementations, these components may be held at temperatures above this range.

Through actively heating and maintaining deposition chamber 600 temperature during processing, the interior reactor walls may be kept at an elevated temperature with respect to the temperature at which wafer 610 is maintained. Elevating the interior reactor wall temperature with respect to the wafer temperature may minimize condensation of the reactants on the interior walls of deposition chamber 600 during flowable film deposition. If condensation of the reactants occurs on the interior walls of deposition chamber 600, the condensate may form a deposition layer on the interior walls, which is undesirable.

In addition to, or alternatively to, heating chamber housing 602 and/or top plate 604, a hydrophobic coating may be applied to some or all of the wetted surfaces of deposition chamber 600 and other components with wetted surfaces, such as pedestal 620, insulating ring 614, or platen 622, to prevent condensation. Such a hydrophobic coating may be resistant to process chemistry and processing temperature ranges, e.g., a processing temperature range of −20° C. to 100° C. Some silicone-based and fluorocarbon-based hydrophobic coatings, such as polyethylene, may not be compatible with an oxidizing, e.g., plasma, environment and may not be suitable for use. Nano-technology based coatings with super-hydrophobic properties may be used; such coatings may be ultra-thin and may also possess oleophobic properties in addition to hydrophobic properties, which may allow such a coating to prevent condensation as well as deposition of many reactants, used in flowable film deposition. One example of a suitable super-hydrophobic coating is titanium dioxide ($TiO_2$).

Deposition chamber 600 may also include remote plasma source port, which may be used to introduce plasma process gases into deposition chamber 600. For example, a remote plasma source port may be provided as a means of introducing a treatment gas to the reaction area without requiring that the treatment gas be routed through showerhead 608. In some embodiments, remote plasma species may be routed through the showerhead 608.

In the context of plasma treatment, a direct plasma or a remote plasma may be employed. In the former case, the treatment gas may be routed through the showerhead. Showerhead 608 may include heater elements or heat conduction paths which may maintain the showerhead temperature within acceptable process parameters during processing. If a direct plasma is to be employed, showerhead 608 may also include an RF electrode for generating plasma environments within the reaction area. Pedestal 620 may also include an RF electrode for generating plasma environments within the reaction area. Such plasma environments may be generated using capacitive coupling between a powered electrode and a grounded electrode; the powered electrode, which may be connected with a plasma generator, may correspond with the RF electrode in showerhead 608. The grounded electrode may correspond with the pedestal RF electrode. Alternative configurations are also possible. The electrodes may be configured to produce RF energy in the 13.56 MHz range, 27 MHz range, or, more generally, between 50 Khz and 60 MHz. In some embodiments, there may be multiple electrodes provided which are each configured to produce a specific frequency range of RF energy. In embodiments wherein showerhead 608 includes a powered RF electrode, chuck 612 may include or act as the grounded RF electrode. For example, chuck 612 may be a grounded aluminum plate, which may result in enhanced cooling across the pedestal-chuck-wafer interface due to aluminum's higher thermal conductivity with respect to other materials, such as ceramics.

Figure 7:
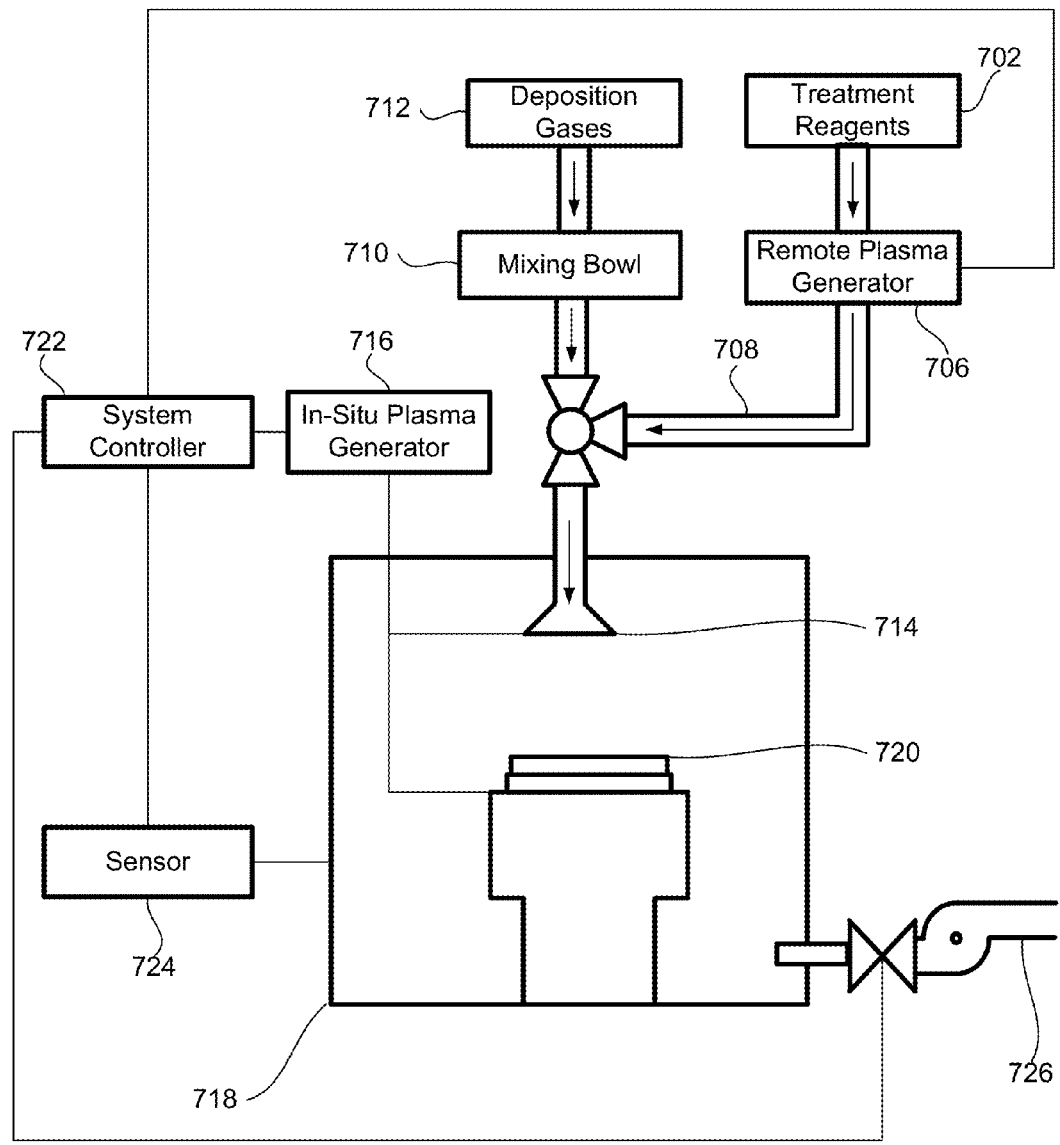

FIG. 7 is a schematic illustration of another example of an apparatus 700 suitable to practice the methods of claimed invention. In this example, the apparatus 700 may be used for flowable dielectric deposition and in situ or remote plasma pre or post treatment. The apparatus 700 includes a processing chamber 718 and a remote plasma generator 706. The processing chamber 718 includes a pedestal 720, a showerhead 714, a control system 722 and other components described below. In the example of FIG. 7, the apparatus 700 also includes a RF generator 716, though this may not be present in some embodiments.

Treatment reagents, such as $H_2$, He, Ar, $N_2$, may be supplied to the remote plasma generator 706 from various treatment reagent sources, such as source 702. A treatment reagent source may be a storage tank containing one or a mixture of reagents. Moreover, a facility wide source of the reagents may be used. The treatment reagent mixture may then be flown through a connecting line 708 into the processing chamber 718, where the mixture is distributed through the showerhead 714 to treat the wafer or other substrate on the pedestal 720.

The chamber 718 may include sensors 724 for sensing various materials and their respective concentrations, pressure, temperature, and other process parameters and providing information on reactor conditions during the process to the system controller 722. Examples of chamber sensors that may be monitored during the process include mass flow controllers, pressure sensors such as manometers, and thermocouples located in pedestal. Sensors 724 may also include an infra-red detector or optical detector to monitor presence of gases in the chamber. Volatile byproducts and other excess gases are removed from the reactor 718 via an outlet 726 that may include a vacuum pump and a valve.

In certain embodiments, a system controller or controller 722 is employed to control process conditions deposition and/or pre or post-treatment. The system controller 722 will typically include one or more memory devices and one or more processors. The processor may include a CPU or computer, analog and/or digital input/output connections, stepper motor controller boards, etc. Typically there will be a user interface associated with system controller 722. The user interface may include a display screen, graphical software displays of the apparatus and/or process conditions, and user input devices such as pointing devices, keyboards, touch screens, microphones, etc.

In certain embodiments, the system controller 722 may also control all of the activities during the process, including gas flow rate, chamber pressure, generator process parameters. The system controller 722 executes system control software including sets of instructions for controlling the timing, mixture of gases, chamber pressure, pedestal (and substrate) temperature, and other parameters of a particular process. The system controller 722 may also control concentration of various process gases in the chamber by regulating valves, liquid delivery controllers and MFCs in the delivery system as well as flow restriction valves and the exhaust line. The system controller 722 executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller 722 controls the transfer of a substrate into and out of various components of the apparatuses.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code and pressure control code.

In some implementations, the controller 722 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 722, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 722 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 722 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 722, in some implementations, may be a part of or coupled to a computer that is integrated with, coupled to the system, otherwise networked to the system, or a combination thereof. For example, the controller 722 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 722 receives instructions in the form of data, which specify parameters for each of the processing steps to be performed during one or more operations. It should be understood that the parameters may be specific to the type of process to be performed and the type of tool that the controller 722 is configured to interface with or control. Thus as described above, the controller 722 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 722 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller parameters relate to process conditions such as, for example, timing of each operation, pressure inside the chamber, substrate temperature, and process gas flow rates. These parameters are provided to the user in the form of a recipe, and may be entered utilizing the user interface. Signals for monitoring the process may be provided by analog and/or digital input connections of the system controller 722. The signals for controlling the process are output on the analog and digital output connections of the apparatus.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or includes together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to compare the shrinkage and evaluate the photosensitivity of an organic acid catalyst. A film was deposited on a wafer using acetic acid and a silicon-containing precursor (AP LTO 400). The wafer was kept in the dark after which it was thermally cured at 375° C. A second film was deposited on a wafer using acetic acid and a silicon-containing precursor (AP LTO 400). The wafer was left in a cleanroom with fluorescent light for an identical length of time as the previous film kept in the dark after which it was thermally cured at 375° C.

The results showed that the film showed photosensitive characteristics such that the film had 38% to 45% less shrinkage after thermal cure for the wafer kept in the dark, compared to the wafer that was left out in the cleanroom fluorescent light. The deposited film also exhibited thickness variation on sections of the wafer that was covered with the visible light masking roof of the foup in which the wafer was stored. The wafer was kept in the upper-most slot of the foup.

Chloride-catalyzed deposited films do not show variation in shrinkage for films left in the dark versus in fluorescent light. The results suggest that acetic acid as a catalyst may exhibit photosensitive catalyzing behavior, which may further the reaction between the catalyst, oxidant, and silicon-containing precursor to deposit a flowable film having improved properties.

Experiment 2

An experiment was conducted to compare the Fourier transform infrared spectroscopy (FTIR) spectra of an uncured film deposited by a halogen-free organic acid catalyst and an uncured film deposited by a halide-acid catalyst.

Figure 8:
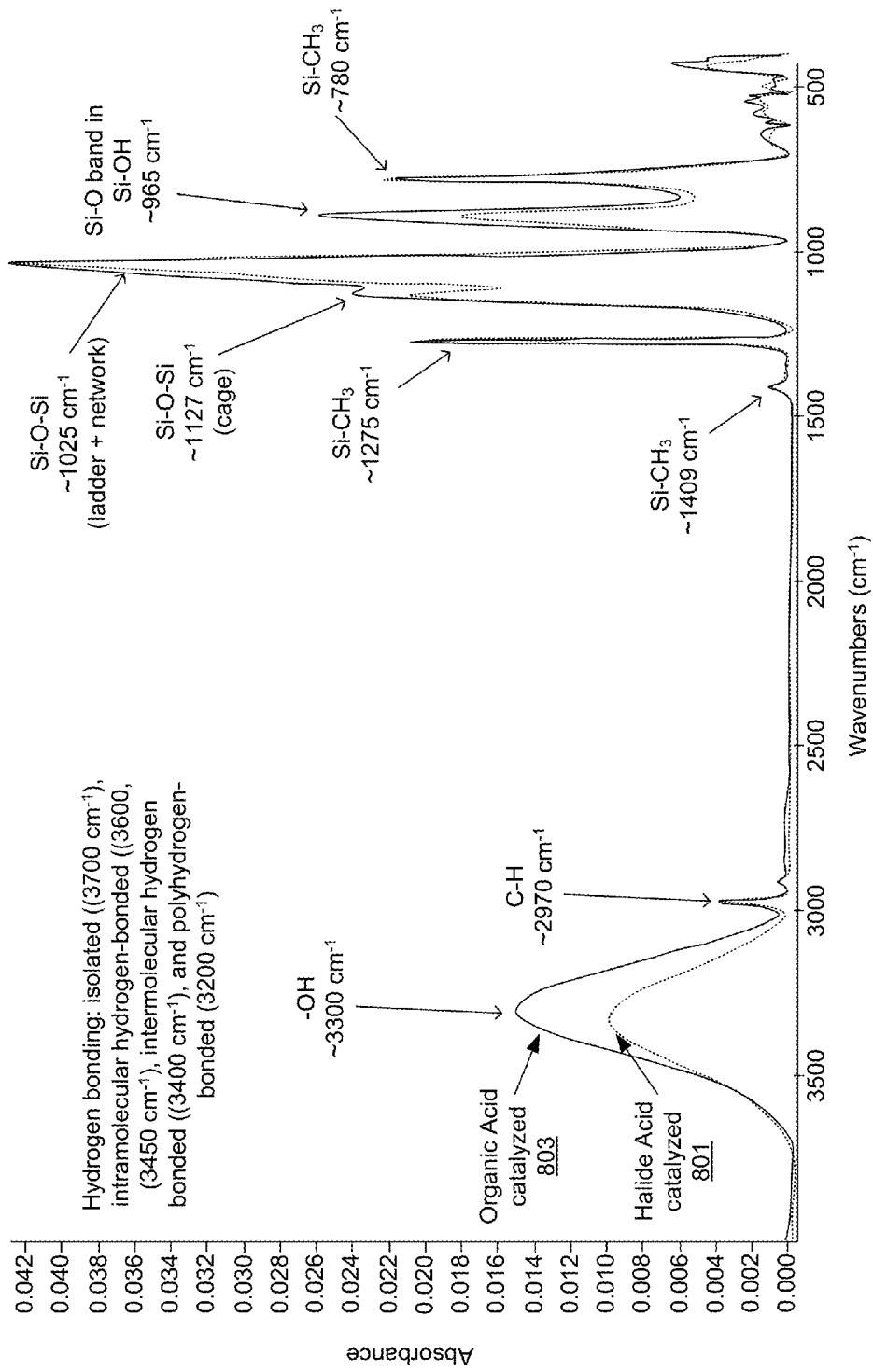
FIGS. 8-12 are FTIR spectra of films deposited compared with films deposited in accordance with various embodiments.

A flowable film was deposited on a wafer using chlorotriethoxysilane as a halide-acid catalyst, and methyltriethoxysilane as the silicon-containing precursor (AP LTO 430®, from Air Products and Chemicals, Inc.), and water as the oxidant. The reactants were introduced to the reaction chamber for a duration of about 220 seconds. The film was deposited to a thickness of about 3500 Angstroms and at a temperature of −0.5° C. and chamber pressure of 45 Torr. The deposited film was analyzed using its FTIR spectrum. The spectrum for the halide-acid catalyzed film is shown in FIG. 8 as curve 801.

A flowable film was deposited on a wafer using acetic acid as a halogen-free organic acid catalyst, AP LTO 400 as the silicon-containing precursor, and water as the oxidant. The reactants were introduced to the reaction chamber for a duration of about 375 seconds. The film was deposited to a thickness of about 3500 Angstroms and at a temperature of −0.5° C. and chamber pressure of 45 Torr. The deposited film was analyzed using its FTIR spectrum, which is shown in FIG. 8 as curve 803.

As shown, the curve associated with organic acid catalyzed film showed a peak at around 3300 $cm^{-1}$ for —OH bonds, which may be attributable to the uncured nature of the deposited film. The halide acid catalyzed film curve had a lower peak for —OH bonds. Note that the organic acid catalyzed film curve has a peak higher than that of the halide acid catalyzed film curve at around 1127 cm$^{-1}$ which is associated with the cage bond network of —Si—O—Si— bonds. The organic acid catalyzed film curve also had a higher peak at around 965 cm$^{-1}$, which is associated with the Si—O band in the Si—OH bonds. Peak integrals were normalized for thickness to match the peak height trends.

Figure 9:
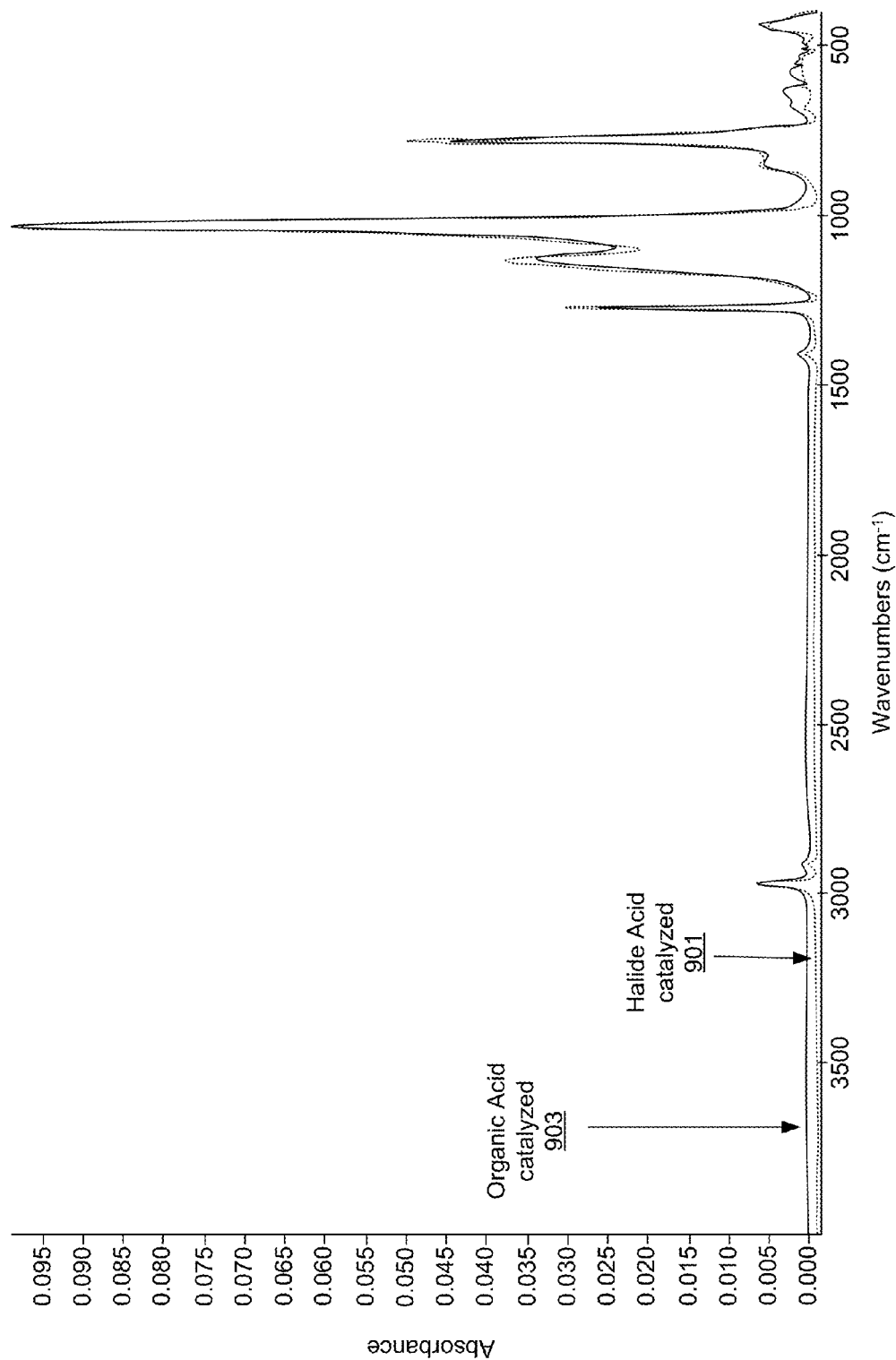

FIG. 9 provides FTIR spectra for the organic-acid catalyzed film (903) and halide-acid catalyzed film (901) after A UV cure was performed on both films. During the UV cure, the reaction replaces all —OH groups with, for example, —CH$_3$. As shown in FIG. 9, the organic acid catalyzed film curve shows almost no —OH groups present. Since the deposited film is similar to that of the halide-acid catalyzed film, but the film is deposited without using a catalyst that may generate any halides that react with underlying metallization layers in the wafer, the results suggest that use of the halogen-free organic acid catalyst is a viable and effective method. Furthermore, without being bound by a particular theory, due to the photosensitivity of various acid catalysts, the rate constant may be increased such that when the wafer is exposed to light, any organic groups may leave the silicon center and help form the —Si—O—Si— network.

Experiment 3

Figure 10:
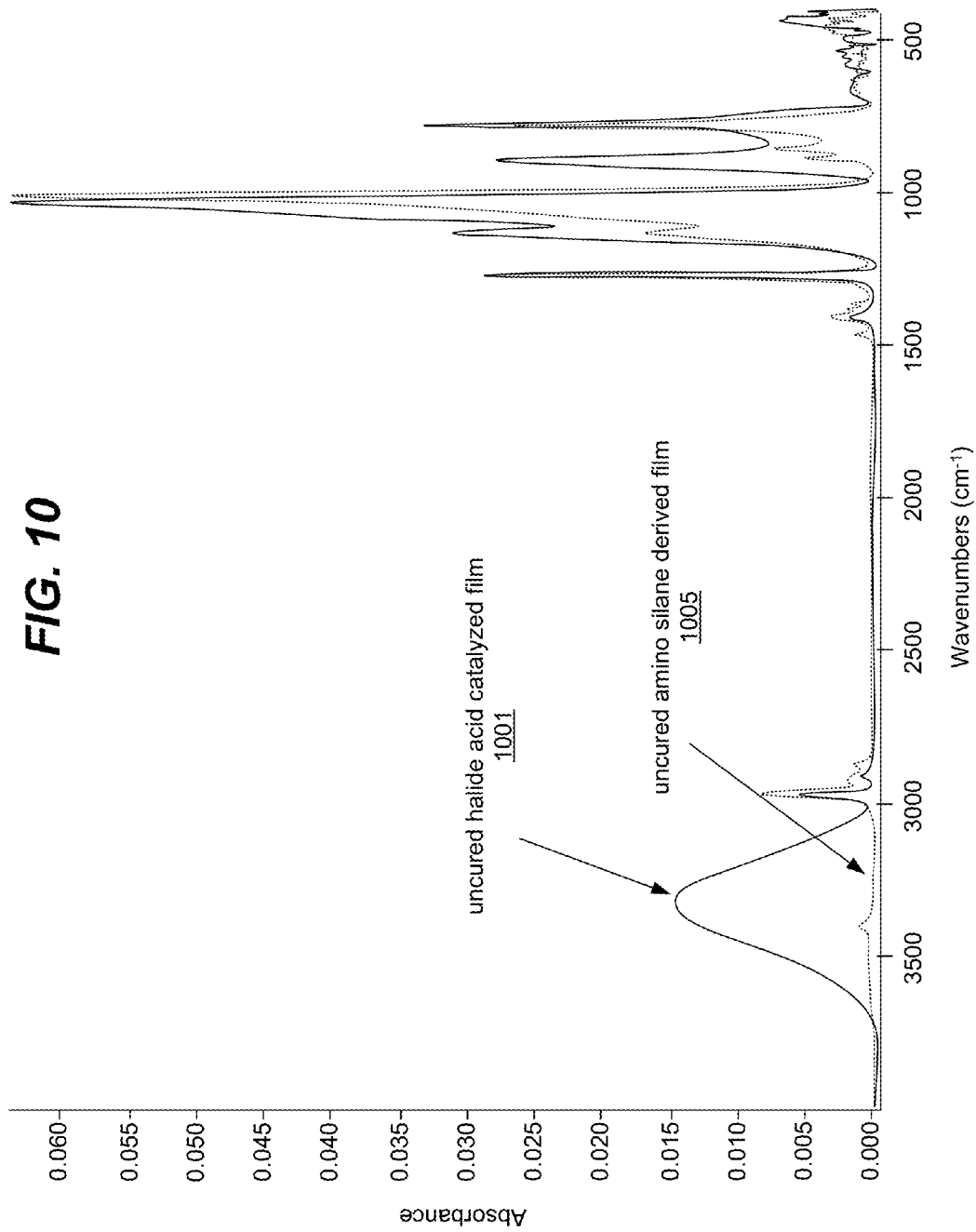

FIG. 10 provides FTIR spectra for an uncured halide-acid catalyzed film 1001 and an uncured aminosilane-derived film 1005. The uncured aminosilane-derived film 1001 shows N—H composition at 3400 cm$^{-1}$ and strong CH$_2$ associated frequencies at 2900 cm$^{-1}$ and 1400 cm$^{-1}$ that are absent from the uncured halide catalyzed film 1105. In the region corresponding to —Si—O—Si— frequencies, a higher fraction of the peak intensity is observed at 1050 cm$^{-1}$, indicating that the alkylamine-catalyzed films may have a more condensed oxide network structure compared to that of halide-catalyzed films.

Figure 11:
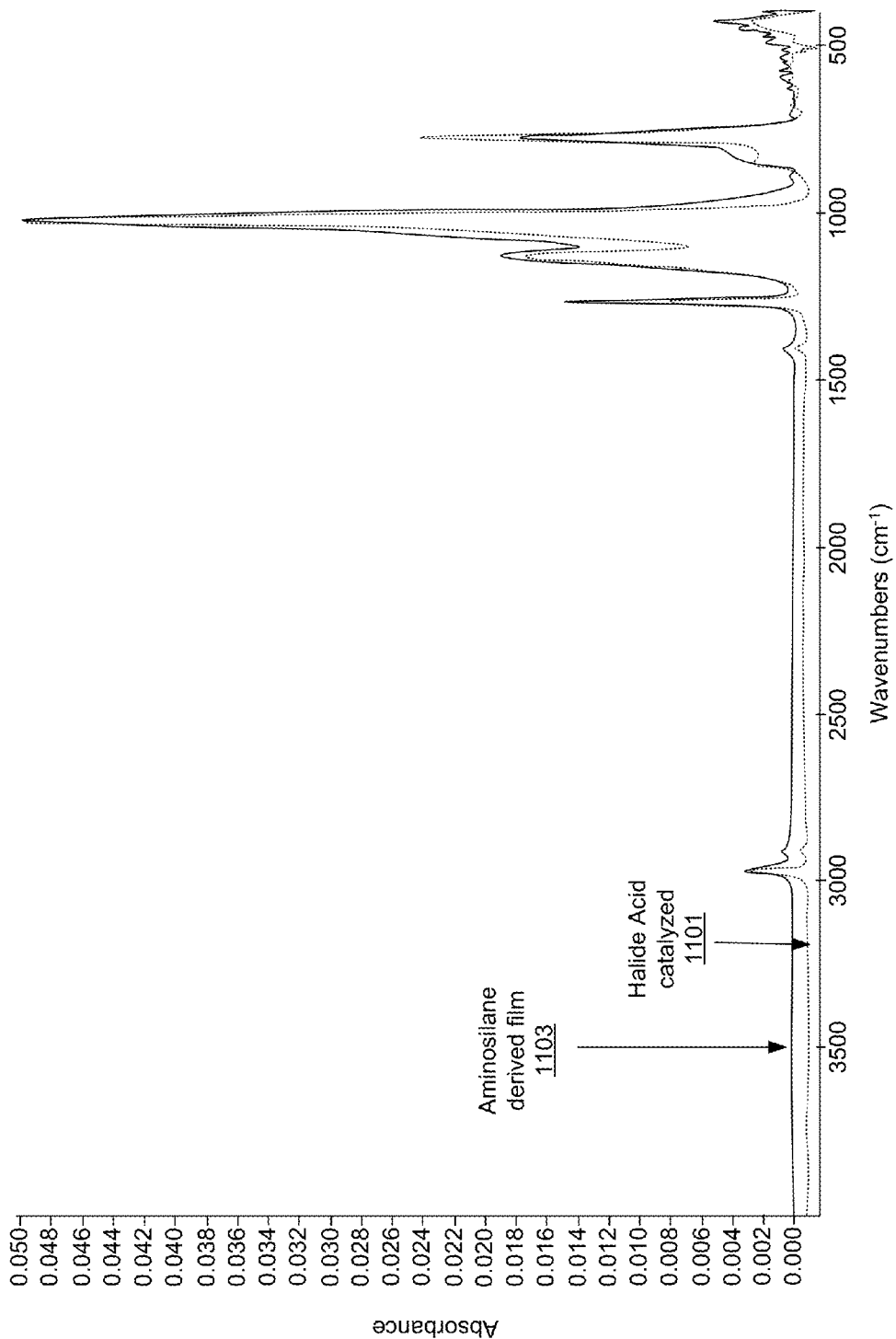

FIG. 11 provides FTIR spectra for the halide-acid catalyzed film 1101 and aminosilane-derived film 1103 after the films were cured by UV. The films have nearly identical FTIR spectra as shown, implying that the films are identical after the UV cure. This suggests that use of the aminosilane precursor is an effective option that eliminates any potential reaction between layers on the substrate and halogens.

Experiment 4

Figure 12:
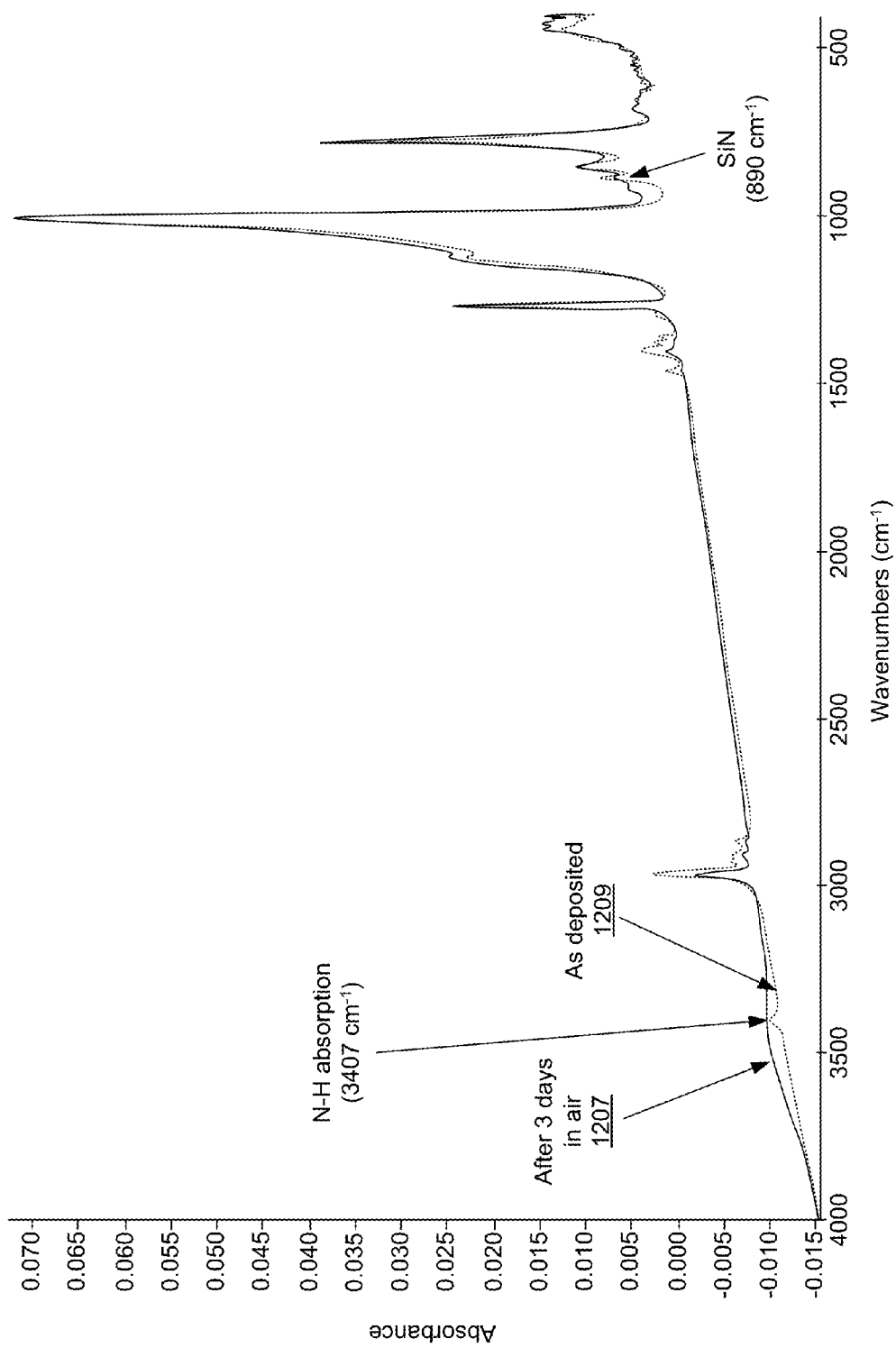

An experiment was conducted to evaluate uncured films deposited using an aminosilane precursor. Uncured aminosilane derived films that contained unhydrolyzed precursor traces ultimately hydrolyze the coordinated amine ligands to —OH groups under ambient conditions. The FTIR spectrum in FIG. 12 shows an uncured film with Si—N and N—H bond frequencies (890 cm$^{-1}$ and 3407 cm$^{-1}$, respectively) from residual silylamines in the precursor that ultimately hydrolyzed into Si—OH (broad band at 3500 cm$^{-1}$) when the film is left under ambient atmosphere.

Experiment 5

Table 1 below shows the refractive index, dielectric constant (k), carbon concentration, and deposition rates for flowable films deposited using an organic acid catalyst, a halide-containing catalyst, and an aminosilane precursor.

TABLE 1

| | | Film Properties | | |
| --- | --- | --- | --- | --- |
| Film Property | Method | Organic Acid Catalyst | Halide Catalyst | Aminosilane Precursor |
| Refractive Index | Spectroscopic Ellipsometer | Cured: 1.393 | Cured: 1.390 | Cured: 1.476 |
| Dielectric Constant (k) | Hg Probe | 2.86 | 2.89 | 3.06 |
| Carbon concentration | FTIR peak area ratio | SiCH$_3$/Si—O—Si: 0.089 | SiCH$_3$/Si—O—Si: 0.069 | SiCH$_3$/Si—O—Si: 0.064 |
| Deposition Rate (uncontrolled for queue time effect) | Optibrobe | 7.5 Å/sec | 12 Å/sec | 28 Å/sec |

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatuses of the present embodiments. Accordingly, the present embodiments are to be considered as illustrative and not restrictive, and the embodiments are not to be limited to the details given herein.

What is claimed is:

1. A method of depositing a film on a semiconductor substrate, the method comprising:
    introducing process gases comprising a silicon-containing precursor, an oxidant, and a halogen-free acid catalyst compound to a reaction chamber; and
    exposing the substrate to the process gases under conditions such that a condensed flowable film forms on the substrate,
    wherein the chemical reactions that form the flowable film comprise a S$_N$1 hydrolysis mechanism and condensation.

2. The method of claim 1, wherein the halogen-free catalyst compound is selected from the group consisting of acetic acid, and photosensitive organic acid catalysts.

3. The method of claim 1, wherein the oxidant is selected from the group consisting of water, ozone, and peroxide.

4. The method of claim 1, wherein the silicon-containing precursor and the oxidant are introduced to the reaction chamber via separate inlets.

5. The method of claim 1, wherein the halogen-free catalyst compound is introduced to the reaction chamber separate from the silicon-containing precursor and the oxidant.

6. The method of claim 1, further comprising treating the flowable film.

7. The method of claim 1, wherein the flowable film seals pores having an average critical dimension between about 1 Å and about 1 nm.

8. The method of claim 2, wherein the photosensitive organic acid catalyst is selected from the group consisting of sulfonic acid, picric acid, tartaric acid, citric acid, ethylenediaminetetraacetic acid, pyrophosphoric acid, substituted derivatives of these acids, and combinations thereof.

9. The method of claim 2, wherein the substrate is exposed to the process gases while the substrate is exposed to UV radiation.

10. The method of claim 6, wherein treating the flowable film comprises exposing the flowable film to the oxidant and exposing the film to a thermal or plasma environment.

11. A method of depositing a film on a semiconductor substrate, the method comprising:
introducing process gases comprising a silicon-containing precursor, an oxidant, and a halogen-free catalyst compound to a reaction chamber; and
exposing the substrate to the process gases under conditions such that a condensed flowable film forms on the substrate,
wherein the catalyst compound is selected from the group consisting of sulfonic acid, picric acid, tartaric acid, citric acid, ethylenediaminetetraacetic acid, pyrophosphoric acid, and combinations thereof.

12. The method of claim 11, wherein the flowable film comprises a carbon-doped silicon oxide film.

13. A method of depositing a film on a semiconductor substrate, the method comprising:
introducing process gases comprising a silicon-containing precursor and an oxidant to a reaction chamber; and
exposing the substrate to the process gases under conditions such that a condensed flowable film forms on the substrate,
wherein the silicon-containing precursor is a halogen-free self-catalyzing aminosilane compound, and
wherein the chemical reactions that form the flowable film comprise a hydrolysis mechanism between an amine group on the aminosilane compound and the oxidant, and condensation.

14. The method of claim 13, wherein the silicon-containing precursor is halogen-free.

15. The method of claim 13, further comprising treating the flowable film by exposing the flowable film to the oxidant.

16. The method of claim 13, wherein the chemical structure of the silicon-containing precursor comprises at least one N-alkylamine group.

17. The method of claim 13, wherein the flowable film seals pores having an average critical dimension between about 1 Å and about 1 nm.

18. The method of claim 16, wherein the chemical structure of a silicon-containing precursor further comprises at least one ligand selected from the group consisting of N-alkyl amine; N,N dialkyl amine; alkoxy; alkyl; alkenyl; alkynyl; aromatic groups; and hydrogen.

19. A method of depositing a film on a semiconductor substrate, the method comprising:
introducing process gases comprising a halogen-free silicon-containing precursor and an oxidant to a reaction chamber; and
exposing the substrate to the process gases under conditions such that a condensed flowable film forms on the substrate,
wherein the halogen-free silicon-containing precursor is selected from the group consisting of dimethylamino trimethylsilane, dimethylaminotriethylsilane, bisdimethylaminodiethylsilane, trisdimethylamino methylsilane, trismethylamino methylsilane, trismethylamino silane, bisdimethylamino dimethylsilane, bisdimethylamino ethoxy methyl silane, methylamino diethoxy methyl silane, trismethylamino vinyl silane, bismethylamino divinyl silane, bisdimethylamino ethoxy vinyl silane acetoxysilane, and combinations thereof.

20. The method of claim 19, further comprising treating the flowable film by exposing the flowable film to the oxidant.

* * * * *